US00RE43741E

(19) United States
(12) Reissued Patent
Shokrollahi et al.

(10) Patent Number: US RE43,741 E
(45) Date of Reissued Patent: Oct. 16, 2012

(54) SYSTEMATIC ENCODING AND DECODING OF CHAIN REACTION CODES

(75) Inventors: M. Amin Shokrollahi, Preverenges (CH); Michael G. Luby, Berkeley, CA (US)

(73) Assignee: QUALCOMM Incorporated, San Diego, CA (US)

(21) Appl. No.: 13/374,565

(22) Filed: Nov. 17, 2011

Related U.S. Patent Documents

Reissue of:
(64) Patent No.: 7,532,132
Issued: May 12, 2009
Appl. No.: 11/894,670
Filed: Aug. 20, 2007

U.S. Applications:
(63) Continuation of application No. 11/104,391, filed on Apr. 11, 2005, now Pat. No. 7,394,407, which is a continuation of application No. 10/677,624, filed on Oct. 1, 2003, now Pat. No. 6,909,383.

(60) Provisional application No. 60/319,597, filed on Oct. 5, 2002.

(51) Int. Cl.
*H03M 7/00* (2006.01)

(52) U.S. Cl. ..... 341/50; 714/801

(58) Field of Classification Search ..... 341/50, 341/51, 55, 60; 714/15, 801, 6, 752
See application file for complete search history.

(56) References Cited

U.S. PATENT DOCUMENTS 3,909,721 A 9/1975 Bussgang et al.
4,365,338 A 12/1982 McRae et al.
4,589,112 A 5/1986 Karim
4,901,319 A 2/1990 Ross
5,136,592 A 8/1992 Weng
5,153,591 A 10/1992 Clark
5,329,369 A 7/1994 Willis et al.
5,331,320 A 7/1994 Cideciyan et al.
5,371,532 A 12/1994 Gelman et al.
5,372,532 A 12/1994 Robertson, Jr.
5,379,297 A 1/1995 Glover et al.
5,421,031 A 5/1995 De Bey
5,425,050 A 6/1995 Schreiber et al.

(Continued)

FOREIGN PATENT DOCUMENTS

CN 1425228 A 6/2003

(Continued)

OTHER PUBLICATIONS

European Search Report—EP02007488—Search Authority—Munich Patent Office—Mar. 24, 2003.

(Continued)

*Primary Examiner* — Joseph Lauture
(74) *Attorney, Agent, or Firm* — Jeffrey D. Jacobs

(57) ABSTRACT

A method of encoding data into a chain reaction code includes generating a set of input symbols from input data. Subsequently, one or more non-systematic output symbols is generated from the set of input symbols, each of the one or more non-systematic output symbols being selected from an alphabet of non-systematic output symbols, and each non-systematic output symbol generated as a function of one or more of the input symbols. As a result of this encoding process, any subset of the set of input symbols is recoverable from (i) a predetermined number of non-systematic output symbols, or (ii) a combination of (a) input symbols which are not included in the subset of input symbols that are to be recovered, and (b) one or more of the non-systematic output symbols.

20 Claims, 18 Drawing Sheets

U.S. PATENT DOCUMENTS

| | | | |
|---|---|---|---|
| 5,432,787 | A | 7/1995 | Chethik |
| 5,455,823 | A | 10/1995 | Noreen et al. |
| 5,465,318 | A | 11/1995 | Sejnoha |
| 5,517,508 | A | 5/1996 | Scott |
| 5,524,025 | A | 6/1996 | Lawrence et al. |
| 5,568,614 | A | 10/1996 | Mendelson et al. |
| 5,583,784 | A | 12/1996 | Kapust et al. |
| 5,608,738 | A | 3/1997 | Matsushita |
| 5,617,541 | A | 4/1997 | Albanese et al. |
| 5,642,365 | A | 6/1997 | Murakami et al. |
| 5,659,614 | A | 8/1997 | Bailey, III |
| 5,699,473 | A | 12/1997 | Kim |
| 5,701,582 | A | 12/1997 | DeBey |
| 5,751,336 | A | 5/1998 | Aggarwal et al. |
| 5,754,563 | A | 5/1998 | White |
| 5,757,415 | A | 5/1998 | Asamizuya et al. |
| 5,805,825 | A | 9/1998 | Danneels et al. |
| 5,835,165 | A | 11/1998 | Keate et al. |
| 5,844,636 | A | 12/1998 | Joseph et al. |
| 5,852,565 | A | 12/1998 | Demos |
| 5,870,412 | A | 2/1999 | Schuster et al. |
| 5,903,775 | A | 5/1999 | Murray |
| 5,917,852 | A | 6/1999 | Butterfield et al. |
| 5,926,205 | A | 7/1999 | Krause et al. |
| 5,933,056 | A | 8/1999 | Rothenberg |
| 5,936,659 | A | 8/1999 | Viswanathan et al. |
| 5,936,949 | A | 8/1999 | Pasternak et al. |
| 5,953,537 | A | 9/1999 | Balicki et al. |
| 5,970,098 | A | 10/1999 | Herzberg |
| 5,983,383 | A | 11/1999 | Wolf |
| 5,993,056 | A | 11/1999 | Vaman et al. |
| 6,005,477 | A | 12/1999 | Deck et al. |
| 6,011,590 | A | 1/2000 | Saukkonen |
| 6,012,159 | A | 1/2000 | Fischer et al. |
| 6,014,706 | A | 1/2000 | Cannon et al. |
| 6,018,359 | A | 1/2000 | Kermode et al. |
| 6,041,001 | A | 3/2000 | Estakhri |
| 6,044,485 | A | 3/2000 | Dent et al. |
| 6,073,250 | A | 6/2000 | Luby et al. |
| 6,079,042 | A | 6/2000 | Vaman et al. |
| 6,081,907 | A | 6/2000 | Witty et al. |
| 6,081,909 | A | 6/2000 | Luby et al. |
| 6,081,918 | A | 6/2000 | Spielman |
| 6,088,330 | A | 7/2000 | Bruck et al. |
| 6,097,320 | A | 8/2000 | Kuki et al. |
| 6,134,596 | A | 10/2000 | Bolosky et al. |
| 6,141,053 | A | 10/2000 | Saukkonen |
| 6,141,788 | A | 10/2000 | Rosenberg et al. |
| 6,154,452 | A | 11/2000 | Marko et al. |
| 6,163,870 | A | 12/2000 | Luby et al. |
| 6,175,944 | B1 | 1/2001 | Urbanke et al. |
| 6,178,536 | B1 | 1/2001 | Sorkin |
| 6,185,265 | B1 | 2/2001 | Campanella |
| 6,195,777 | B1 | 2/2001 | Luby et al. |
| 6,223,324 | B1 | 4/2001 | Sinha et al. |
| 6,229,824 | B1 | 5/2001 | Marko |
| 6,243,846 | B1 | 6/2001 | Schuster et al. |
| 6,272,658 | B1 | 8/2001 | Steele et al. |
| 6,278,716 | B1 | 8/2001 | Rubenstein et al. |
| 6,298,462 | B1 | 10/2001 | Yi |
| 6,307,487 | B1 | 10/2001 | Luby |
| 6,314,289 | B1 | 11/2001 | Eberlein et al. |
| 6,320,520 | B1 | 11/2001 | Luby |
| 6,333,926 | B1 | 12/2001 | Van Heeswyk et al. |
| 6,373,406 | B2 | 4/2002 | Luby |
| 6,393,065 | B1 | 5/2002 | Piret et al. |
| 6,411,223 | B1 | 6/2002 | Haken et al. |
| 6,415,326 | B1 | 7/2002 | Gupta et al. |
| 6,420,982 | B1 | 7/2002 | Brown |
| 6,421,387 | B1 | 7/2002 | Rhee |
| 6,430,233 | B1 | 8/2002 | Dillon et al. |
| 6,445,717 | B1 | 9/2002 | Gibson et al. |
| 6,459,811 | B1 | 10/2002 | Hurst, Jr. |
| 6,466,698 | B1 | 10/2002 | Creusere |
| 6,473,010 | B1 | 10/2002 | Vityaev et al. |
| 6,486,803 | B1 | 11/2002 | Luby et al. |
| 6,487,692 | B1 | 11/2002 | Morelos-Zaragoza |
| 6,496,980 | B1 | 12/2002 | Tillman et al. |
| 6,497,479 | B1 | 12/2002 | Stoffel et al. |
| 6,523,147 | B1 | 2/2003 | Kroeger et al. |
| 6,535,920 | B1 | 3/2003 | Parry et al. |
| 6,577,599 | B1 | 6/2003 | Gupta et al. |
| 6,584,543 | B2 | 6/2003 | Williams et al. |
| 6,609,223 | B1 | 8/2003 | Wolfgang |
| 6,614,366 | B2 | 9/2003 | Luby |
| 6,618,451 | B1 | 9/2003 | Gonikberg |
| 6,633,856 | B2 | 10/2003 | Richardson et al. |
| 6,641,366 | B2 | 11/2003 | Nordhoff |
| 6,643,332 | B1 | 11/2003 | Morelos-Zaragoza et al. |
| 6,677,864 | B2 | 1/2004 | Khayrallah |
| 6,678,855 | B1 | 1/2004 | Gemmell |
| 6,694,476 | B1 | 2/2004 | Sridharan et al. |
| 6,704,370 | B1 | 3/2004 | Chheda et al. |
| 6,732,325 | B1 | 5/2004 | Tash et al. |
| 6,742,154 | B1 | 5/2004 | Barnard |
| 6,748,441 | B1 | 6/2004 | Gemmell |
| 6,751,772 | B1 | 6/2004 | Kim et al. |
| 6,765,866 | B1 | 7/2004 | Wyatt |
| 6,810,499 | B2 | 10/2004 | Sridharan et al. |
| 6,820,221 | B2 | 11/2004 | Fleming |
| 6,831,172 | B1 | 12/2004 | Barbucci et al. |
| 6,849,803 | B1 | 2/2005 | Gretz |
| 6,850,736 | B2 | 2/2005 | McCune, Jr. |
| 6,856,263 | B2 | 2/2005 | Shokrollahi et al. |
| 6,868,083 | B2 | 3/2005 | Apostolopoulos et al. |
| 6,882,618 | B1 | 4/2005 | Sakoda et al. |
| 6,895,547 | B2 | 5/2005 | Eleftheriou et al. |
| 6,909,383 | B2 | 6/2005 | Shokrollahi et al. |
| 6,928,603 | B1 | 8/2005 | Castagna et al. |
| 6,937,618 | B1 | 8/2005 | Noda et al. |
| 6,956,875 | B2 | 10/2005 | Kapadia et al. |
| 6,965,636 | B1 | 11/2005 | DesJardins et al. |
| 6,995,692 | B2 | 2/2006 | Yokota et al. |
| 7,010,052 | B2 | 3/2006 | Dill et al. |
| 7,030,785 | B2 | 4/2006 | Shokrollahi et al. |
| 7,057,534 | B2 | 6/2006 | Luby |
| 7,068,729 | B2 | 6/2006 | Shokrollahi et al. |
| 7,072,971 | B2 | 7/2006 | Lassen et al. |
| 7,110,412 | B2 | 9/2006 | Costa et al. |
| 7,139,660 | B2 | 11/2006 | Sarkar et al. |
| 7,139,960 | B2 | 11/2006 | Shokrollahi |
| 7,154,951 | B2 | 12/2006 | Wang |
| 7,164,370 | B1 | 1/2007 | Mishra |
| 7,168,030 | B2 | 1/2007 | Ariyoshi |
| 7,219,289 | B2 | 5/2007 | Dickson |
| 7,231,404 | B2 | 6/2007 | Paila et al. |
| 7,233,264 | B2 | 6/2007 | Luby |
| 7,240,236 | B2 | 7/2007 | Cutts et al. |
| 7,240,358 | B2 | 7/2007 | Horn et al. |
| 7,243,285 | B2 | 7/2007 | Foisy et al. |
| 7,249,291 | B2 | 7/2007 | Rasmussen et al. |
| 7,254,754 | B2 | 8/2007 | Hetzler et al. |
| 7,257,764 | B2 | 8/2007 | Suzuki et al. |
| 7,265,688 | B2 | 9/2007 | Shokrollahi et al. |
| 7,293,222 | B2 | 11/2007 | Shokrollahi et al. |
| 7,318,180 | B2 | 1/2008 | Starr |
| 7,320,099 | B2 | 1/2008 | Miura et al. |
| 7,391,717 | B2 | 6/2008 | Klemets et al. |
| 7,394,407 | B2 | 7/2008 | Shokrollahi et al. |
| 7,398,454 | B2 | 7/2008 | Cai et al. |
| 7,409,626 | B1 | 8/2008 | Schelstraete |
| 7,412,641 | B2 | 8/2008 | Shokrollahi |
| 7,418,651 | B2 | 8/2008 | Luby et al. |
| 7,451,377 | B2 | 11/2008 | Shokrollahi |
| 7,483,489 | B2 | 1/2009 | Gentric et al. |
| 7,512,697 | B2 | 3/2009 | Lassen et al. |
| 7,525,994 | B2 | 4/2009 | Scholte |
| 7,532,132 | B2 | 5/2009 | Shokrollahi et al. |
| 7,559,004 | B1 | 7/2009 | Chang et al. |
| 7,570,665 | B2 | 8/2009 | Ertel et al. |
| 7,590,118 | B2 | 9/2009 | Giesberts et al. |
| 7,597,423 | B2 | 10/2009 | Silverbrook |
| 7,613,183 | B1 | 11/2009 | Brewer et al. |
| 7,633,413 | B2 | 12/2009 | Shokrollahi et al. |
| 7,633,970 | B2 | 12/2009 | Van Kampen et al. |
| 7,644,335 | B2 | 1/2010 | Luby et al. |
| 7,650,036 | B2 | 1/2010 | Lei et al. |

| | | | |
|---|---|---|---|
| 7,711,068 | B2 | 5/2010 | Shokrollahi et al. |
| 7,720,174 | B2 | 5/2010 | Shokrollahi et al. |
| 7,721,184 | B2 | 5/2010 | Luby et al. |
| 7,812,743 | B2 | 10/2010 | Luby |
| 7,831,896 | B2 | 11/2010 | Amram et al. |
| 2001/0033586 | A1 | 10/2001 | Takashimizu et al. |
| 2002/0049947 | A1 | 4/2002 | Sridharan et al. |
| 2002/0053062 | A1 | 5/2002 | Szymanski |
| 2002/0081977 | A1 | 6/2002 | McCune, Jr. |
| 2002/0085013 | A1 | 7/2002 | Lippincott |
| 2002/0087685 | A1 | 7/2002 | Lassen et al. |
| 2002/0133247 | A1 | 9/2002 | Smith et al. |
| 2002/0191116 | A1 | 12/2002 | Kessler et al. |
| 2003/0037299 | A1 | 2/2003 | Smith |
| 2003/0058958 | A1 | 3/2003 | Shokrollahi et al. |
| 2003/0086515 | A1 | 5/2003 | Trans et al. |
| 2003/0101408 | A1 | 5/2003 | Martinian et al. |
| 2003/0106014 | A1 | 6/2003 | Dohmen et al. |
| 2003/0226089 | A1 | 12/2003 | Rasmussen et al. |
| 2003/0235219 | A1 | 12/2003 | Kapadia et al. |
| 2004/0031054 | A1 | 2/2004 | Dankworth et al. |
| 2004/0066854 | A1 | 4/2004 | Hannuksela |
| 2004/0075592 | A1 | 4/2004 | Shokrollahi et al. |
| 2004/0075593 | A1 | 4/2004 | Shokrollahi et al. |
| 2004/0117716 | A1 | 6/2004 | Shen |
| 2004/0151109 | A1 | 8/2004 | Batra et al. |
| 2004/0151206 | A1 | 8/2004 | Scholte |
| 2004/0153468 | A1 | 8/2004 | Paila et al. |
| 2004/0207548 | A1 | 10/2004 | Kilbank |
| 2004/0231004 | A1 | 11/2004 | Seo |
| 2005/0018635 | A1 | 1/2005 | Proctor |
| 2005/0028067 | A1 | 2/2005 | Weirauch |
| 2005/0041736 | A1 | 2/2005 | Butler-Smith et al. |
| 2005/0102371 | A1 | 5/2005 | Aksu |
| 2005/0102598 | A1 | 5/2005 | Shokrollahi |
| 2005/0138286 | A1 | 6/2005 | Franklin et al. |
| 2005/0152359 | A1 | 7/2005 | Giesberts et al. |
| 2005/0169379 | A1 | 8/2005 | Shin et al. |
| 2005/0195899 | A1 | 9/2005 | Han |
| 2005/0195900 | A1 | 9/2005 | Han |
| 2005/0219070 | A1 | 10/2005 | Shokrollahi |
| 2005/0249222 | A1 | 11/2005 | Van Kampen et al. |
| 2005/0254575 | A1 | 11/2005 | Hannuksela et al. |
| 2005/0257106 | A1 | 11/2005 | Luby et al. |
| 2006/0020796 | A1 | 1/2006 | Aura et al. |
| 2006/0036930 | A1 | 2/2006 | Luby et al. |
| 2006/0037057 | A1 | 2/2006 | Xu |
| 2006/0048036 | A1 | 3/2006 | Miura et al. |
| 2006/0080588 | A1 | 4/2006 | Starr |
| 2006/0093634 | A1 | 5/2006 | Lutz et al. |
| 2006/0109805 | A1 | 5/2006 | Malamal Vadakital et al. |
| 2006/0136797 | A1 | 6/2006 | Cai et al. |
| 2006/0193524 | A1 | 8/2006 | Tarumoto et al. |
| 2006/0212782 | A1 | 9/2006 | Li |
| 2006/0262856 | A1 | 11/2006 | Wu et al. |
| 2006/0279437 | A1 | 12/2006 | Luby et al. |
| 2006/0280254 | A1 | 12/2006 | Luby et al. |
| 2007/0028099 | A1 | 2/2007 | Entin et al. |
| 2007/0078876 | A1 | 4/2007 | Hayashi et al. |
| 2007/0081562 | A1 | 4/2007 | Ma |
| 2007/0081586 | A1 | 4/2007 | Raveendran et al. |
| 2007/0110074 | A1 | 5/2007 | Bradley et al. |
| 2007/0127576 | A1 | 6/2007 | Henocq et al. |
| 2007/0134005 | A1 | 6/2007 | Myong et al. |
| 2007/0157267 | A1 | 7/2007 | Lopez-Estrada |
| 2007/0176800 | A1 | 8/2007 | Rijavec |
| 2007/0195894 | A1 | 8/2007 | Shokrollahi et al. |
| 2007/0201549 | A1 | 8/2007 | Hannuksela et al. |
| 2007/0204196 | A1 | 8/2007 | Watson et al. |
| 2007/0230568 | A1 | 10/2007 | Eleftheriadis et al. |
| 2007/0233784 | A1 | 10/2007 | Orourke et al. |
| 2007/0300127 | A1 | 12/2007 | Watson et al. |
| 2008/0034273 | A1 | 2/2008 | Luby |
| 2008/0052753 | A1 | 2/2008 | Huang et al. |
| 2008/0058958 | A1 | 3/2008 | Cheng |
| 2008/0059532 | A1 | 3/2008 | Kazmi et al. |
| 2008/0086751 | A1 | 4/2008 | Horn et al. |
| 2008/0134005 | A1 | 6/2008 | Izzat et al. |
| 2008/0152241 | A1 | 6/2008 | Itoi et al. |
| 2008/0168133 | A1 | 7/2008 | Osborne |
| 2008/0168516 | A1 | 7/2008 | Flick et al. |
| 2008/0172712 | A1 | 7/2008 | Munetsugu |
| 2008/0232357 | A1 | 9/2008 | Chen |
| 2008/0256418 | A1 | 10/2008 | Luby et al. |
| 2008/0303893 | A1 | 12/2008 | Kim et al. |
| 2008/0303896 | A1 | 12/2008 | Lipton et al. |
| 2008/0309525 | A1 | 12/2008 | Shokrollahi et al. |
| 2009/0003439 | A1 | 1/2009 | Wang et al. |
| 2009/0031199 | A1 | 1/2009 | Luby et al. |
| 2009/0043906 | A1 | 2/2009 | Hurst et al. |
| 2009/0067551 | A1 | 3/2009 | Chen et al. |
| 2009/0106356 | A1 | 4/2009 | Brase et al. |
| 2009/0125636 | A1 | 5/2009 | Li et al. |
| 2009/0150557 | A1 | 6/2009 | Wormley et al. |
| 2009/0158114 | A1 | 6/2009 | Shokrollahi |
| 2009/0189792 | A1 | 7/2009 | Shokrollahi et al. |
| 2009/0195640 | A1 | 8/2009 | Kim et al. |
| 2009/0201990 | A1 | 8/2009 | Leprovost et al. |
| 2009/0204877 | A1 | 8/2009 | Betts |
| 2009/0210547 | A1 | 8/2009 | Lassen et al. |
| 2009/0222873 | A1 | 9/2009 | Einarsson |
| 2009/0287841 | A1 | 11/2009 | Chapweske et al. |
| 2009/0307565 | A1 | 12/2009 | Luby et al. |
| 2009/0319563 | A1 | 12/2009 | Schnell |
| 2010/0011274 | A1 | 1/2010 | Stockhammer et al. |
| 2010/0020871 | A1 | 1/2010 | Hannuksela et al. |
| 2010/0046906 | A1 | 2/2010 | Kanamori et al. |
| 2010/0103001 | A1 | 4/2010 | Shokrollahi et al. |
| 2010/0165077 | A1 | 7/2010 | Yin et al. |
| 2010/0211690 | A1 | 8/2010 | Pakzad et al. |
| 2010/0223533 | A1 | 9/2010 | Stockhammer et al. |
| 2010/0235472 | A1 | 9/2010 | Sood et al. |
| 2011/0019769 | A1 | 1/2011 | Shokrollahi et al. |
| 2011/0083144 | A1 | 4/2011 | Bocharov et al. |
| 2011/0096828 | A1 | 4/2011 | Chen et al. |
| 2011/0103519 | A1 | 5/2011 | Shokrollahi et al. |
| 2011/0119394 | A1 | 5/2011 | Wang et al. |
| 2011/0119396 | A1 | 5/2011 | Kwon et al. |
| 2011/0216541 | A1 | 9/2011 | Inoue et al. |
| 2011/0231519 | A1 | 9/2011 | Luby et al. |
| 2011/0231569 | A1 | 9/2011 | Luby et al. |
| 2011/0238789 | A1 | 9/2011 | Luby et al. |
| 2011/0239078 | A1 | 9/2011 | Luby et al. |
| 2011/0258510 | A1 | 10/2011 | Watson et al. |
| 2011/0280311 | A1 | 11/2011 | Chen et al. |
| 2011/0280316 | A1 | 11/2011 | Chen et al. |
| 2011/0299629 | A1 | 12/2011 | Luby et al. |
| 2012/0013746 | A1 | 1/2012 | Chen et al. |
| 2012/0016965 | A1 | 1/2012 | Chen et al. |
| 2012/0020413 | A1 | 1/2012 | Chen et al. |
| 2012/0042050 | A1 | 2/2012 | Chen et al. |
| 2012/0042089 | A1 | 2/2012 | Chen et al. |
| 2012/0042090 | A1 | 2/2012 | Chen et al. |

FOREIGN PATENT DOCUMENTS

| | | | |
|---|---|---|---|
| CN | 1792056 | A | 6/2006 |
| EP | 0669587 | A2 | 8/1995 |
| EP | 0784401 | A2 | 7/1997 |
| EP | 0854650 | A2 | 7/1998 |
| EP | 0903955 | A1 | 3/1999 |
| EP | 1024672 | A1 | 8/2000 |
| EP | 1051027 | A1 | 11/2000 |
| EP | 1124344 | A1 | 8/2001 |
| EP | 1298931 | A2 | 4/2003 |
| EP | 1455504 | A2 | 9/2004 |
| EP | 1468497 | A1 | 10/2004 |
| EP | 1501318 | A1 | 1/2005 |
| EP | 1670256 | A2 | 6/2006 |
| EP | 1755248 | A1 | 2/2007 |
| EP | 2046044 | A1 | 4/2009 |
| EP | 2071827 | A2 | 6/2009 |
| EP | 1241795 | A2 | 8/2009 |
| EP | 2096870 | A2 | 9/2009 |
| EP | 1700410 | B1 | 4/2010 |
| EP | 2323390 | A2 | 5/2011 |
| JP | 11112479 | | 4/1999 |
| JP | 2000216835 | A | 8/2000 |
| JP | 2000307435 | A | 11/2000 |

| | | | |
|---|---|---|---|
| JP | 2001036417 | | 2/2001 |
| JP | 2001274855 | A | 10/2001 |
| JP | 2002204219 | A | 7/2002 |
| JP | 2003018568 | A | 1/2003 |
| JP | 2003507985 | | 2/2003 |
| JP | 2004048704 | A | 2/2004 |
| JP | 2004135013 | A | 4/2004 |
| JP | 2004165922 | A | 6/2004 |
| JP | 2004289621 | A | 10/2004 |
| JP | 2005514828 | T | 5/2005 |
| JP | 2005204170 | A | 7/2005 |
| JP | 2005223433 | A | 8/2005 |
| JP | 2006505177 | A | 2/2006 |
| JP | 2006074335 | A | 3/2006 |
| JP | 2006074421 | A | 3/2006 |
| JP | 3809957 | | 6/2006 |
| JP | 2006174032 | A | 6/2006 |
| JP | 3976163 | | 6/2007 |
| JP | 2007520961 | A | 7/2007 |
| JP | 2008508762 | A | 3/2008 |
| JP | 2008543142 | A | 11/2008 |
| JP | 2008502212 | A | 1/2011 |
| JP | 2001189665 | A | 2/2011 |
| KR | 20100028156 | A | 3/2010 |
| RU | 2189629 | C2 | 9/2002 |
| RU | 2265960 | C2 | 12/2005 |
| WO | WO9634463 | A1 | 10/1996 |
| WO | WO9804973 | A1 | 2/1998 |
| WO | WO9832231 | | 7/1998 |
| WO | WO0014921 | A1 | 3/2000 |
| WO | WO00018017 | | 3/2000 |
| WO | WO0052600 | A1 | 9/2000 |
| WO | WO0120786 | A1 | 3/2001 |
| WO | WO0157667 | A1 | 8/2001 |
| WO | WO0158130 | A2 | 8/2001 |
| WO | WO0158131 | A2 | 8/2001 |
| WO | WO0227988 | A2 | 4/2002 |
| WO | WO0247391 | | 6/2002 |
| WO | WO03056703 | | 7/2003 |
| WO | WO03105350 | | 12/2003 |
| WO | WO2004008735 | A2 | 1/2004 |
| WO | WO2004015948 | A1 | 2/2004 |
| WO | WO2004019521 | A1 | 3/2004 |
| WO | WO2004030273 | A1 | 4/2004 |
| WO | WO2004034589 | A2 | 4/2004 |
| WO | WO2004040831 | A1 | 5/2004 |
| WO | WO2004047455 | A1 | 6/2004 |
| WO | WO2005036753 | A2 | 4/2005 |
| WO | WO2005041421 | A1 | 5/2005 |
| WO | WO2005078982 | A1 | 8/2005 |
| WO | WO2005112250 | A2 | 11/2005 |
| WO | WO2006020826 | A2 | 2/2006 |
| WO | WO2006084503 | A1 | 8/2006 |
| WO | WO2007042916 | | 4/2007 |
| WO | WO2007090834 | A2 | 8/2007 |
| WO | WO2008054100 | A1 | 5/2008 |
| WO | WO2008085013 | A1 | 7/2008 |
| WO | WO2008148708 | A1 | 12/2008 |
| WO | WO2008156390 | A1 | 12/2008 |
| WO | WO2010085361 | A2 | 7/2010 |
| WO | WO2010088420 | A1 | 8/2010 |
| WO | WO2010120804 | A1 | 10/2010 |

OTHER PUBLICATIONS

International Search Report, PCT/US1999/021574—International Search Authority—European Patent Office, Jan. 28, 2000.

International Preliminary Examination Report—PCT/US00/025405—Oct. 29, 2001.

International Search Report, PCT/US2000/025405—International Search Authority—European Patent Office, Mar. 1, 2001.

International Preliminary Examination Report, PCT/US2002/041615—International Preliminary Examining Authority—US, May 12, 2004.

International Search Report, PCT/US2002/041615—International Search Authority—US, Mar. 26, 2003.

Supplementary European Search Report, EP02794439—European Search Authority—The Hague, Jan. 13, 2005.

International Preliminary Report on Patentability, PCT/US2005/016334—The International Bureau of WIPO—Geneva, Switzerland, Nov. 7, 2006.

International Search Report, PCT/US2005/016334—International Search Authority—European Patent Office, Sep. 12, 2006.

Written Opinion, PCT/US2005/016334—International Search Authority—European Patent Office, Sep. 12, 2006.

Supplementary European Search Report, EP05747947—European Search Authority—Munich, Mar. 19, 2007.

International Preliminary Report on Patentability, PCT/US2005/028668—The International Bureau of WIPO—Geneva, Switzerland, Jun. 26, 2007.

International Search Report, PCT/US2005/028668—International Search Authority—US, Jun. 7, 2007.

Written Opinion, PCT/US2005/028668—International Search Authority—European Patent Office, Jun. 7, 2007.

"3rd Generation Partnership Project; Technical Specification Group Services and System Aspects; Transparent end-to-end Packet-switched Streaming Service (PSS); Protocols and codecs (Release 9)", Dec. 2009, 179 pages.

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.

3rd Generation Partnership Project, Technical Specification Group Services and System Aspects Transparent end-to-end packet switched streaming service (PSS), 3GPP file format (3GP) (Release 9) , 3GPP Standard, 3GPP TS 26.244, 3rd Generation Partnership Project (3GPP), Mobile Competence Centre, 650, Route Des Lucioles , F-06921 Sophia-Antipolis Cedex , France, No. V8.1.0, Jun. 1, 2009 (Jun. 1, 2009), pp. 1-52, XP050370199.

3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010 (Jun. 9, 2010), pp. 1-55, XP050441544, [retrieved on Jun. 9, 2010].

Afzal, et al., "Video Streaming over MBMS: A System Design Approach", Journal of Multimedia, vol. 1, No. 5, Aug. 2006, pp. 25-35.

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Albanese, A., et al., "Priority Encoding Transmission", IEEE Transactions on Information Theory, vol. 42, No. 6, pp. 1-22, (Nov. 1996).

Alex Zambelli,"IIS Smooth Streaming Technical Overview", Microsoft Mar. 25, 2009 (Mar. 25, 2009), XP002620446, Retrieved from the Internet: URL:http://www.microsoft.com/downloads/en/details.aspx"FamilyID=03d22583-3ed6-44da-8464-blb4b5ca7520, [retrieved on Jan. 21, 2011].

Aljoscha Smolic et al., "Development of a New MPEG Standard for Advanced 3D Video Applications", IEEE International Symposium on Image and Signal Processing and Analysis, Sep. 16, 2009 (Sep. 16, 2009), pp. 400-407, XP031552049, ISBN: 978-953-184-135-1.

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation 2 Apr. 1, 2003 (Apr. 2, 2003), XP002360065 Retrieved from the Internet: URL: http ://www . ipm. ac . ir/IPM/homepage/Amin 2. pdf [retrieved on Dec. 19, 2005].
Amon P. et al., "File Format for Scalable Video Coding", IEEE Transactions on Circuits and Systems for Video Technology, IEEE Service Center, Piscataway, NJ, US, vol. 17, No. 9, Sep. 1, 2007 (Sep. 1, 2007), pp. 1174-1185, XP011193013, ISSN: 1051-8215, DOI:10. 1109/TCSVT.2007.905521.
Anonymous: [Gruneberg, K., Narasimhan, S. and Chen, Y., editors] "Text of ISO/IEC 13818-1:2007/PDAM 6 MVC operation point descriptor", 90 MPEG Meeting; Oct. 26, 2009-Oct. 30, 2009; Xian; (Motion Picture Expertgroup or ISO/IEC JTC1/SC29/WG111), No. N10942, Nov. 19, 2009 (Nov. 19, 2009), XP030017441.
Anonymous: "Text of ISO/IEC 14496-12 3rd Edition", 83 MPEG Meeting; Jan. 14, 2008-Jan. 18, 2008; Antalya; (Motion Pictureexpert Group or ISO/IEC JTC1/SC29/WG11), No. N9678, Apr. 22, 2008 (Apr. 22, 2008), XP030016172.
Anonymous: "Text of ISO/IEC 14496-12:2008/PDAM 2 Sub-track selection & switching", 91. Mpeg Meeting; Jan. 18, 2010-Jan. 22, 2010; Kyoto; (Motion Picture Expertgroup or ISO/IEC JTC1/SC29/ WG11), No. N11137, Jan. 22, 2010 (Jan. 22, 2010), XP030017634, ISSN: 0000-0030.
Anonymous: "Text of ISO/IEC 14496-15 2nd edition", 91 MPEG Meeting; Jan. 18, 2010-Jan. 22, 2010; Kyoto; (Motion Picture Expertgroup or ISO/IEC JTC1/SC29/WG11) No. N11139, Jan. 22, 2010 (Jan. 22, 2010), XP030017636.
Apple Inc., "On the time-stamps in the segment-inbox for httpstreaming (26.244, R9)", TSG-SA4#58 meeting, Vancouver, Canada, Apr. 2010, p. 5.
Bar-Noy, et al., "Competitive on-line stream merging algorithms for media-on-demand", Draft (Jul. 2000), pp. 1-34.
Bar-Noy et al. "Efficient algorithms for optimal stream merging for media-on-demand," Draft (Aug. 2000), pp. 1-43.
Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 889-893, XP000464977.
Bitner, J.R., et al.: "Efficient Generation of the Binary Reflected Gray code and Its Applications," Communications of the ACM, pp. 517-521, vol. 19 (9), 1976.
Blomer, et al., "An XOR-Based Erasure-Resilient Coding Scheme," ICSI Technical Report No. TR-95-048 (1995) [avail. At ftp://ftp.icsi. berkeley.edu/pub/techreports/1995/tr-95-048.pdf].
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Byers, J.W. et al.: "Accessing multiple mirror sites in parallel: using Tornado codes to speed up downloads," 1999, Eighteenth Annual Joint Conference of the IEEE Comupter and Communications Societies, pp. 275-283, Mar. 21, 1999, XP000868811.
Charles Lee L.H, "Error-Control Block Codes for Communications Engineers", 2000, Artech House, XP002642221 pp. 39-45.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Chen Ying et al., "Coding techniques in Multiview Video Coding and Joint Multiview Video Model", Picture Coding Symposium, 2009, PCS 2009, IEEE, Piscataway, NJ, USA, May 6, 2009 (May 6, 2009), pp. 1-4, XP031491747, ISBN: 978-1-4244-4593-6.
Choi S: "Temporally enhanced erasure codes for reliable communication protocols" Computer Networks, Elsevier Science Publishers B.V., Amsterdam, NL, vol. 38, No. 6, Apr. 22, 2002 (Apr. 22, 2002), pp. 713-730, XP004345778, ISSN: 1389-1286, DOI:10.1016/ S1389-1286(01)00280-8.
Clark G.C., et al., "Error Correction Coding for Digital Communications, System Applications," Error Correction Coding for Digital Communications, New York, Plenum Press, US, Jan. 1, 1981, pp. 339-341.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009 (Dec. 31, 2009), pp. 1-10, XP002582035 Retrieved from the Internet: URL:http://www.hindawi.com/journals/ ijdmb/2009/614178.html> [retrieved on May 12, 2010].
Dan, A. et al.: "Scheduling Policies for an On-Demand Video Server with Batching," Proc. ACM Multimedia, pp. 15-23 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normalization ISO/IEC JTC1/SC29/WG11 Coding of Moving Pictures and Audio", ISO/IEC 2003, Aug. 11, 2003, pp. 1-34.
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/ TSGS4_34/Docs.
Digital Fountain: "Raptor code specification for MBMS file download," 3GPP SA4 PSM AD-HOC #31 (May 21, 2004) XP002355055 pp. 1-6.
"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008 (Apr. 1, 2008), XP014041619 ISSN: 0000-0001 p. 43 p. 66 pp. 70, 71.
DVB-IPI Standard: DVD BlueBook A086r4 (Mar. 2007) Transport of MPEG 2 Transport Streatm (TS) Based DVB Servicesover IP Based Networks, ETSI Technical Specification 102 034 v1.3.1.
Eager, et al. "Minimizing bandwidth requirements for on-demand data delivery," Proceedings of the International Workshop on Advances in Multimedia Information Systems, p. 80-87 (Indian Wells, CA Oct. 1999).
Eager, et al., "Optimal and efficient merging schedules for video-on-demand servers", Proc. ACM Multimedia, vol. 7, pp. 199-202 (1999).
Esaki, et al.: "Reliable IP Multicast Communication Over ATM Networks Using Forward Error Correction Policy," IEICE Transactions on Communications, JP, Institute of Electronics Information and Comm. ENG. Tokyo, vol. E78-V, No. 12, (Dec. 1995), pp. 1622-1637, XP000556183.
European Search Report—EP04794541 ,Search Authority—Munich Patent Office, Oct. 25, 2010.
European Search Report—EP09007850, Search Authority—Munich Patent Office, Jun. 17, 2010.
European Search Report—EP09007850, Search Authority—Munich Patent Office, Aug. 9, 2010.
European Search Report—EP10002379, Search Authority—Munich Patent Office, May 5, 2010.
European Search Report—EP10011741—Search Authority—Munich—Feb. 28, 2011.
European Search Report—EP10013219—Search Authority—Hague—Jun. 20, 2011.
European Search Report—EP10013220—Search Authority—The Hague—Jun. 15, 2011.
European Search Report—EP10013221—Search Authority—The Hague—Jun. 29, 2011.
European Search Report—EP10013222—Search Authority—Hague—Jun. 28, 2011.
European Search Report—EP10013224—Search Authority—Munich—Feb. 17, 2011.
European Search Report—EP10013225—Search Authority—Munich—Feb. 21, 2011.
European Search Report—EP10013226—Search Authority—Munich—Feb. 17, 2011.
European Search Report—EP10013227—Search Authority—Munich—Feb. 17, 2011.
European Search Report—EP10013231, Search Authority—Hague Patent Office, Mar. 15, 2011.
Feng, G., Error Correcting Codes over Z2m for Algorithm-Based Fault-Tolerance, IEEE Transactions on Computers, vol. 43, No. 3, Mar. 1994, pp. 370-374.
Fernando, et al., "httpstreaming of MPEG Media—Response to CfP", 93 MPEG Meeting; Jul. 26, 2010-Jul. 30, 2010; Geneva;

(Motion Picture Expert Group or ISO/IEC JTC1/SCE29/WG11), No. M17756, Jul. 22, 2010 (Jul. 22, 2010), XP030046346.
Fielding et al., "RFC 2616: Hypertext Transfer Protocol HTTP/1.1", Internet Citation, Jun. 1999 (Jun. 1999), pp. 165, XP002196143, Retrieved from the Internet: URL:http://www.rfc-editor-org/ [retrieved on Apr. 15, 2002].
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).
Gasiba, Tiago et al., "System Design and Advanced Receiver Techniques for MBMS Broadcast Services" Proc. 2006 International Conference on Communications (ICC 2006), Jun. 1, 2006 (Jun. 1, 2006), pp. 5444-5450, XP031025781 ISBN: 978-1-4244-0354-7.
Gemmell, et al., "A Scalable Multicast Architecture for One-to-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Goyal: "Multiple Description Coding: Compression Meets the Network," In Signal Processing Magazine, IEEE, vol. 18., Issue 5 (Sep. 2001) pp. 74-93 URL:http://www.rle.mit.edu/stir/documents/Goyal_SigProcMag2001_MD.pdf [Nov. 4, 2007].
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009 (May 13, 2009), pp. 1-5, XP031480155 ISBN: 978-1-4244-2590-7.
Grineberg, et al., "Deliverable D3.2 MVC/SVC storage format" Jan. 29, 2009 (Jan. 29, 2009), XP002599508 Retrieved from the Internet: URL:http://www.ist.sea.eu/Public/SEA_D3.2_HHI FF_20090129.pdf [retrieved on Sep. 1, 2010] paragraph [02.3].
Hagenauer, J. : "Soft is better than hard" Communications, Coding and Cryptology, Kluwer Publication May 1994 (May 1994), XP002606615 Retrieved from the Internet : URL: http://www. Int . ei . turn. de/veroeffentlic hungen/1994/ccc94h. pdf [retrieved on Oct. 25, 2010].
He Wenge et al., "Asymmetric Stereoscopic Video Encoding Algorithm Based on Joint Compensation Prediction", IEEE International Conference on Communications and Mobile Computing, Jan. 6, 2009 (Jan. 6, 2009), pp. 191-194, XP031434775, ISBN: 978-0-7695-3501-2.
Hershey, et al., "Random Parity Coding (RPC)", 1996 IEEE International Conference on Communications (ICC). Converging Technologies for Tomorrow's Applications. Dallas, Jun. 23-27, 1996, IEEE International Conference on Communications (ICC), New York, IEEE, US, vol. 1, Jun. 23, 1996, pp. 122-126, XP000625654.
Hitachi Ltd. et al., "High-Definition Multimedia Interface," Specification Version 1.3a, Nov. 10, 2006, 276 pp.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan video-on-demand systems", Proc. ACM SIGCOMM, pp. 89-100 (Cannes, France, 1997).
Ian Trow, "Is 3D Event Coverage Using Existing Broadcast Infrastructure Technically Possible", International Broadcasting Conference, Sep. 9, 2009 (Sep. 9, 2009),-Sep. 13, 2009 (Sep. 13, 2009), XP030081671, pp. 4-5, "3D transmission over broadcast infrastructure" pp. 7-8, "Screen signaling"—Conclusions on 3D systems.
IETF RFC 2733: Rosenberg, J. et al. "An RTP Payload Format for Generic Forward Error Correction," Network Working Group, RFC 2733 (Dec. 1999).
Information Technology—Generic Coding of Moving Pictures and Audio: Systems, Amendment 4: Transport of Multiview Video over ITU-T Rec H.222.0 | ISO/IEC 13818-1 "Text of ISO/IEC 13818-1:2007/FPDAM 4—Transport of Multiview Video over ITU-T Rec H.222.0 | ISO/IEC 13818-1," Lausanne, Switzerland, 2009, 21 pp.
International Preliminary Examination Report, PCT/US2001/048114—International Preliminary Examining Authority—US, Oct. 17, 2003.
International Preliminary Examination Report, PCT/US2003/031108—International Preliminary Examining Authority—US, Sep. 22, 2004.
International Preliminary Report on Patentability—PCT/US2008/060510, International Search Authority—European Patent Office—Oct. 29, 2009.
International Preliminary Report on Patentability, PCT/US06/022913—The International Bureau of WIPO—Geneva, Switzerland, Aug. 26, 2008.
International Preliminary Report on Patentability, PCT/US2007/062086—The International Bureau of WIPO—Geneva, Switzerland, Aug. 19, 2008.
International Preliminary Report on Patentability, PCT/US2007/062302—The International Bureau of WIPO—Geneva, Switzerland, Aug. 26, 2008.
International Preliminary Report on Patentability, PCT/US2007/068713—The International Bureau of WIPO—Geneva, Switzerland, Nov. 11, 2008.
International Search Report—PCT/US03/018353—International Search Authority—EPO—Sep. 26, 2003.
International Search Report—PCT/US2007/068713—International Search Authority, European Patent Office, Jan. 8, 2008.
International Search Report—PCT/US2007/62086, International Search Authority—European Patent Office—Nov. 1, 2007.
International Search Report and Written Opinion—PCT/US2004/033222, International Search Authority—European Patent Office—Sep. 13, 2006.
International Search Report and Written Opinion—PCT/US2008/076299, International Search Authority—European Patent Office—Nov. 28, 2008.
International Search Report and Written Opinion—PCT/US2010/025699—ISA/EPO—Jun. 18, 2010.
International Search Report and Written Opinion—PCT/US2010/046027, ISA/EPO—Aug. 17, 2011.
International Search Report and Written Opinion—PCT/US2010/049842, ISA/EPO—Jun. 28, 2011.
International Search Report and Written Opinion—PCT/US2010/049852, International Search Authority—European Patent Office—Feb. 17, 2011.
International Search Report and Written Opinion—PCT/US2010/049862, ISA/EPO—Jun. 27, 2011.
International Search Report and Written Opinion—PCT/US2010/049874, International Search Authority—European Patent Office—Feb. 16, 2011.
International Search Report and Written Opinion—PCT/US2011/036499, ISA/EPO—Aug. 29, 2011.
International Search Report and Written Opinion—PCT/US2011/042444, ISA/EPO—Oct. 5, 2011.
International Search Report and Written Opinion—PCT/US2011/042447, ISA/EPO—Oct. 7, 2011.
International Search Report and Written Opinion—PCT/US2011/043885—ISA/EPO—Dec. 9, 2011.
International Search Report and Written Opinion—PCT/US2011/044284, ISA/EPO—Oct. 21, 2011.
International Search Report and Written Opinion—PCT/US2011/044745—ISA/EPO—Dec. 21, 2011.
International Search Report and Written Opinion—PCT/US2011/047121—ISA/EPO—Oct. 26, 2011.
International Search Report and Written Opinion—PCT/US2011/047125—ISA/EPO—Oct. 26, 2011.
International Search Report and Written Opinion—PCT/US2011/047128—ISA/EPO—Oct. 26, 2011.
International Search Report and Written Opinion—PCT/U S2010/024207, International Search Authority—European Patent Office—Jul. 21, 2010.
International Search Report and Written Opinion—PCT/US2010/049869—ISA EPO—Aug. 4, 2011.
International Search Report, PCT/US06/022913—International Search Authority—US, Jul. 18, 2008.
International Search Report, PCT/US2001/048114—International Search Authority—US, May 9, 2002.
International Search Report, PCT/US2003/031108—International Search Authority—European Patent Office, Apr. 13, 2004.

International Search Report, PCT/US2006/022914—International Search Authority—US, Feb. 9, 2007.
International Search Report, PCT/US2007/062302—International Search Authority—US, Dec. 21, 2007.
International Search Report, PCT/US2008/060510—International Search Authority—Aug. 1,2008.
International Standard ISO/IEC 13818-1:2000(E), "Information Technology—Generic Coding of Moving Pictures and Associated Audio Information: Systems," Second edition, Dec. 1, 2000, pp. 1-174.
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC 14996-12 International Standard, "Information technology-Coding of audio-visual objects Part 12: ISO base media file format," Oct. 1, 2005, 94 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
ISO/IEC JTC1/SC29/WG11: "Requirements on HTTP Streaming of MPEG Media", 92. MPEG Meeting; Apr. 19, 2010-Apr. 23, 2010; Dresden; No. N11340, May 14, 2010 (May 14, 2010), XP030017837, ISSN: 0000-0029.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005 (Mar. 18, 2005), pp. 1097-1100, XP010792442, DOI: 10.1109/ICASSP.2005.1415905 ISBN: 978-0-7803-8874-1.
"Joint Draft 8.0 on Multiview Video Coding", 28th JVT meeting, Hannover, Germany, Document: JVT-AB204 (rev.1), Jul. 2008. available from http:// wftp3. itu.int/av-arch/jvt-site/2008_07_Hannover/JVT-AB204.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.
Kimata H et al., "Inter-View Prediction With Downsampled Reference Pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007 (Apr. 19, 2007), XP030007039.
Kozamernik F: "Media streaming over the Internet", Internet Citation, Oct. 2002 (Oct. 2002), XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding-Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007 (Oct. 1, 2007), XP015055125, ISSN: 0000-0003.
Luby, et al., "Analysis of Low Density Codes and Improved Designs Using Irregular Graphs", 1998, Proceedings of the 30TH Annual ACM Symposium on Theory of Computing, May 23, 1998, pp. 249-258, XP000970907.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, et al., "FLUTE—File Delivery over Unidirectional Transport", IETF RFC 3926, pp. 1-35, (Oct. 2004).
Luby et al., "Improved Low-Density Parity-Check Codes Using Irregular Graphs and Belief Propagation", Information Theory, 1998. Proceedings. 1998 IEEE International Symposium on Cambridge, MA, USA Aug. 16-21, 1998, pp. 1-9, New York, NY, USA, IEEE, US Aug. 16, 199.
Luby et, al. "Layered Coding Transport (LCT) Building Block", IETF RRC 5651, pp. 1-42, (Oct. 2009).
Luby, M. et al.: "Efficient Erasure Correction Codes," 2001, IEEE Transactions on Information Theory, Vo. 47, No. 2, pp. 569-584, XP002305225.
Luby, M., et, al. "Forward Error Correction (FEC) Building Block", IETF RFC 5052, pp. 1-31, (Aug. 2007).
Luby M et al: "IPTV Systems, Standards and Architectures: Part II—Application Layer FEC in IPTV Services" IEEE Communications Magazine, IEEE Service Center, Piscataway, US LNKDDOI: 10.1109/MCOM.2008.4511656, vol. 46, No. 5, May 1, 2008 (May 1, 2008), pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M. et al., "Practical Loss-Resilient Codes: Tornado Codes," 29th Annual ACM Symposium on Theory of Computing, vol. SYMP. 29, May 4, 1997, pp. 150-159, XP002271229.
Luby, M., et al., "Raptor Forward Error Correction Scheme for Object Delivery", IETF RFC5053, pp. 1-46 (Sep. 2007).
Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: The Use of Forward Error Correction (FEC) in Reliable Multicast," Internet Article, [Online] Dec. 2002, pp. 1-19.
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal.acm.prg.citation.cfm"id=314722>.
Mandelbaum D.M., "An Adaptive-Feedback Coding Scheme Using Incremental Redundancy", IEEE Trans on Information Theory, vol. May 1974, May 1974 (May 1974), pp. 388-389, XP002628271, the whole document.
Marpe, et al., "The H.264/MPEG4 Advanced Video Coding Standard and its Applications," Standards Report, IEEE Communications Magazine, Aug. 2006, pp. 134-143.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
McCanne, et al., "Low-Complexity Video Coding for Receiver-Driven Layered Multicast", IEEE Journal on Selected Areas in Communication IEEE Service Center, Aug. 1, 1997 (Aug. 1, 1997), vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008 (Jan. 29, 2008), pp. 1-9, XP002581808 Retrieved from the Internet: URL:http://www.digitalfountain.com/ufiles/ library/DVB-T-whitepaper.pdf> [retrieved on May 10, 2010].
Min-Goo Kim: "On systematic punctured convolutional codes", IEEE Trans on Communications, vol. 45, No. 2, Feb. 1997 (Feb. 1997), XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.

Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.
Nokia: "Reed-Solomon Code Specification for. MBMS Download and Streaming Services", 3GPP Draft; 54-050265__RS__SPEC, 3rd Generation Partnership Project (3GPP), Mobile Competence Centre; 650, Route Des Lucioles ; F-06921 Sophia-Antipolis Cedex ; France, vol. SA WG4, no. San Diego, USA; 20050415, Apr. 15, 2005 (Apr. 15, 2005), XP050287675, [retrieved on Apr. 15, 2005].
Nokia Corp., "Usage of 'mfra' box for Random Access and Seeking," S4-AHI127, 3GPP TSG-SA4 Ad-Hoc Meeting, Dec. 14-16, 2009, Paris, FR 2 pp.
Nonnenmacher, et al., "Parity-Based Loss Recovery for Reliable Multicast Transmission", IEEE / ACM Transactions on Networking, IEEE Inc. New York, US, vol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
Pa. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos R et al., "HTTP Live Streaming; draft-pantos-http-1ive-streaming-OT.txt", HTTP Live Streaming; Draft-Pantos-HTTP-Live-Streaming-01.TXT, Internet Engineering Task Force, IETF; Standardworkingdraft, Internet Society (ISOC) 4, Rue Des Falaises CH—1205 Geneva, Switzerland, No. 1, Jun. 8, 2009 (Jun. 8, 2009), XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Petition decision for Petition Under 37 C.F.R. § 1.78 to Accept an Unintentionally Delayed Priority Claim under 35 U.S.C. § 120 in U.S. Patent No. 7,532,132, dated Jul. 21, 2011, 2 pages.
Petition under 37 C.F.R. § 1.78 to Accept an Unintentionally Delayed Priority Claim under 35 U.S.C. § 120 in U.S. Patent No. 7,532,132, dated May 27, 2011, 2 pages.
Plank J. S., "A Tutorial on Reed-Solomon Coding for Fault-Tolerance I N. Raid-Like Systems", Software Practice & Experience, Wiley & Sons, Bognor Regis, GB, vol. 27, No. 9, Sep. 1, 1997 (Sep. 1, 1997), pp. 995-1012, XP00069594.
Pless and WC Huffman EDS V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010 (Jul. 22, 2010), XP030046492.
Qualcomm Europe S A R L: "Baseline Architecture and Definitions for HTTP Streaming", 3GPP Draft; S4-090603__HTTP__STREAMING__ARCHITECTURE, 3rd Generation Partnership Project (3GPP), Mobile Competence Centre; 650, Route Des Lucioles; F-06921 Sophia-Antipolis Cedex; France, no. Kista; 20090812, Aug. 12, 2009 (Aug. 12, 2009), XP050356889.
Qualcomm Incorporated: "Use Cases and Examples for Adaptive httpstreaming", 3GPP Draft; S4-100408-Usecases-HSD, 3rd Generation Partnership Project (JGPP), Mobile Competence Centre; 650, Route Des Lucioles; F-06921 Sophia-Antipolis Cedex; France, vol. SA WG4, no. Prague, Czech Republic; 20100621, Jun. 17, 2010 (Jun. 17, 2010), XP050438085, [retrieved on Jun. 17, 2010].
Rangan, et al., "Designing an On-Demand Multimedia Service," IEEE Communication Magazine, vol. 30, pp. 56-64, (Jul. 1992).
Realnetworks Inc, et al., "Format for httpstreaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, no. S t Julians, Malta; 20100125, Jan. 20, 2010, XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, no. Prague, Czech Republic; 20100621, Jun. 16, 2010 (Jun. 16, 2010), XP050438066, [retrieved on Jun. 16, 2010].
Rhyu, et al., "Response to Call for Proposals on httpstreaming of MPEG Media", 93 MPEG Meeting; Jul. 26, 2010-Jul. 30, 2010; Geneva; (Motion Picture Expert Group or ISO/IEC JTC1/SCE29/WG11) No. M17779, Jul. 26, 2010 (Jul. 26, 2010), XP030046369.
Rizzo, L. "Effective Erasure Codes for Reliable Computer Communication Protocols," Computer Communication Review, 27 (2) pp. 24-36 (Apr. 1, 1997), XP000696916.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Roca, V., et, al. "Low Density Parity Check (LDPC) Staircase and Triangle Forward Error Correction (FEC) Schemes", IETF RFC 5170 (Jun. 2008), pp. 1-34.
Rost, S. et al., "The Cyclone Server Architecture: streamlining delivery of popular content," 2002, Computer Communications, vol. 25, No. 4, pp. 1-10.
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.
Seshan, S. et al., "Handoffs in Cellular Wireless Networks: The Daedalus Implementation and Experience," Wireless Personal Communications, NL; Kluwer Academic Publishers, vol. 4, No. 2 (Jan. 3, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T REC. H.222.0(May 2006)FPDAM 4, vol. MPEG2009, No. 10572, May 11, 2009 (May 11, 2009), pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm"id=1148681>.
Shokrollahi et al., "Design of Efficient Easure Codes with Differential Evolution", IEEE International Symposium on Information Theory, Jun. 25, 2000 (Jun. 25, 2000), pp. 5-5.
Sincoskie, W. D., "System Architecture for Large Scale Video on Demand Service," Computer Network and ISDN Systems, pp. 155-162, (1991).
Stockhammer, "WD 0.1 of 23001-6 Dynamic Adaptive Streaming over HTTP (DASH)" MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.

Sullivan et al., Document: JVT-AA007, "Editors' Draft Revision to ITU-T Rec. H.264|ISO/IEC 14496-10 Advanced Video Coding—in Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Supplementary European Search Report—EP06772989—Search Authority—Munich—Nov. 4, 2011.
Supplementary European Search Report—EP06772990—Search Authority—Munich—Sep. 28, 2011.
Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, no. St Julians, Malta; 20100125, Jan. 20, 2010 (Jan. 20, 2010), XP050437773, [retrieved on Jan. 20, 2010].
Thomas Wiegand, et al., "Joint Draft ITU-T Rec. H.264 | ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.
Tsunoda T., et al., "Reliable Streaming Contents Delivery by Using Multiple Paths," Technical Report of The Institute of Electronics, Information and Communication Engineers, Japan, Mar. 2004, vol. 103, No. 692, pp. 187-190, NS2003-331, IN2003-286.
U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010 (Jun. 1, 2010), XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].
Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan,Subramaniyam R., "Publishing in Wireless and Wireline Environments," Ph.D Thesis, Rutgers, The State University of New Jersey (Nov. 1994), 180pages.
Wang,"On Random Access", Joint Video Team (JVT) of ISO/IEC MPEG & ITU-T VCEG (ISO/IEC JTC1ISC29/WG11 and ITU-T SG16 Q.6), 4th Meeting: Klagenfurt, Austria, Jul. 22-26, 2002, p. 13.
Watson, M., et, al. "Asynchronous Layered Coding (ALC) Protocol Instantiation", IETF RFC 5775, pp. 1-23, (Apr. 2010).
Wenger, et al., RFC 3984, "RTP Payload Format for H.264 Video," Feb. 2005, 84 pp.
Wong, J.W., "Broadcast delivery", Proceedings of the IEEE, 76(12): 1566-1577, (1988).
Written Opinion, PCT/US06/022913—International Search Authority—US, Jul. 18, 2008.
Written Opinion, PCT/US2006/022914—International Search Authority—US, Feb. 9, 2007.
Written Opinion, PCT/US2007/062086—International Search Authority—European Patent Office, Nov. 1, 2007.
Written Opinion, PCT/US2007/062302—International Search Authority—US, Dec. 21, 2007.
Written Opinion, PCT/US2007/068713—International Search Authority—US, Jan. 7, 2008.
Written Opinion, PCT/US2008/060510—International Search Authority—Aug. 1, 2008.
Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.
Yin et al., "Modified Belief-Propogation algorithm for Decoding of Irregular Low-Density Parity-Check Codes", Electronics Letters, IEE Stevenage, GB, vol. 38, No. 24, Nov. 21, 2002 (Nov. 21, 2002), pp. 1551-1553.
Ying Chen et al: "Response to the CfP on HTTP Streaming: Adaptive Video Streaming based on AVC", 93 MPEG Meeting; Jul. 26, 2010-Jul. 30, 2010; Geneva; (Motion Picture Expert Group or ISO/IEC JTC1/SC29/WG11), No. M17909, Jul. 26, 2010 (Jul. 26, 2010), XP030046499.
Zorzi, et al.: "On the Statistics of Block Errors in Bursty Channels," IEEE Transactions on Communications, vol. 45, No. 6, Jun. 1997, pp. 660-667.
Cataldi et al., "Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Gracie et al., "Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPR0C.2007.895197.
Huawei et al., "Implict mapping between CCE and PUCCH for ACK/NACK TDD", 3GPP Draft; R1-082359, 3RD Generation Partnership Project (3GPP), Mobile Competence Centre; 650, Route Des Lucioles ; F-06921 Sophia-Antipolis Cedex ; France, vol. RAN WG1, no. Warsaw, Poland, Jun. 24, 2008, XP050110650, [retrieved on Jun. 24, 2008].
Kimura et al., "A Highly Mobile SDM-0FDM System Using Reduced-Complexity-and-Latency Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
MacKay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-C0M:20050237.
Todd, "Error Correction Coding: Mathematical Methods and Algorithms", Mathematical Methods and Algorithms, Jan. 1, 2005, pp. 451-534, Wiley, XP002618913.

$$\begin{bmatrix} 0 & 1 & 0 & 0 & 0 & 0 & 0 & 0 & 0 \\ 1 & 0 & 0 & 0 & 1 & 0 & 0 & 0 & 1 \\ 0 & 1 & 0 & 0 & 1 & 0 & 0 & 0 & 0 \\ 0 & 0 & 0 & 0 & 0 & 0 & 0 & 0 & 1 \\ 0 & 0 & 1 & 0 & 0 & 1 & 0 & 1 & 0 \\ 0 & 0 & 1 & 0 & 0 & 0 & 1 & 0 & 1 \\ 0 & 0 & 0 & 1 & 0 & 0 & 1 & 0 & 0 \\ 0 & 0 & 0 & 0 & 1 & 0 & 0 & 1 & 0 \\ 0 & 0 & 1 & 1 & 0 & 0 & 1 & 0 & 0 \\ 1 & 0 & 0 & 0 & 1 & 1 & 0 & 0 & 0 \\ 0 & 0 & 0 & 0 & 0 & 0 & 0 & 0 & 1 \\ 0 & 1 & 0 & 1 & 0 & 0 & 0 & 1 & 1 \end{bmatrix}$$

FIG. 4

| $C_0$ | $C_1$ | $C_2$ | $C_3$ | $C_4$ | $C_5$ | $C_6$ | $C_7$ | $C_8$ |
|---|---|---|---|---|---|---|---|---|
| D(0) | D(1) | D(2) | D(3) | D(4) | D(5) | D(6) | D(7) | D(9) |

SYSTEMATIC ENCODING AND DECODING OF CHAIN REACTION CODES

Matter enclosed in heavy brackets [ ] appears in the original patent but forms no part of this reissue specification; matter printed in italics indicates the additions made by reissue.

CROSS-REFERENCE TO RELATED APPLICATIONS

This application claims the benefit of U.S. Provisional Application No. 60/319,597 entitled "Systematic Encoding and Decoding of Chain Reaction Codes," filed Oct. 5, 2002, the contents of which are herein incorporated by reference in its entirety for all purposes.

BACKGROUND

The following invention relates to systems and methods for encoding and decoding data of all types, and more particularly to systems and methods for encoding and decoding data using chain reaction codes.

Transmission of data between a sender and a recipient over a communications channel has been the subject of much literature. Preferably, but not exclusively, a recipient desires to receive an exact copy of data transmitted over a channel by a sender with some level of certainty. Where the channel does not have perfect fidelity (which covers most of all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

Another consideration in selecting a code is the protocol used for transmission. In the case of the Internet, a packet protocol is used for data transport. That protocol is called the Internet Protocol or "IP" for short. When a file or other block of data is to be transmitted over an IP network, it is partitioned into equal size input symbols and input symbols are placed into consecutive packets. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable.

A transmission is called reliable if it allows the intended recipient to recover an exact copy of the original file even in the face of erasures in the network. On the Internet, packet loss often occurs because sporadic congestion causes the buffering mechanism in a router to reach its capacity, forcing it to drop incoming packets. Protection against erasures during transport has been the subject of much study.

The Transport Control Protocol ("TCP") is a point-to-point packet control scheme in common use that has an acknowledgment mechanism. Using TCP, a sender transmits ordered packets and the recipient acknowledges receipt of each packet. If a packet is lost, no acknowledgment will be sent to the sender and the sender will resend the packet. With protocols such as TCP, the acknowledgment paradigm allows packets to be lost without total failure, since lost packets can just be retransmitted, either in response to a lack of acknowledgment or in response to an explicit request from the recipient.

Although acknowledgment-based protocols are generally suitable for many applications and are in fact widely used over the current Internet, they are inefficient, and sometimes completely infeasible, for certain applications as described in Luby I.

One solution that has been proposed to solve the transmission problem is to avoid the use of an acknowledgment-based protocol, and instead use Forward Error-Correction (FEC) codes, such as Reed-Solomon codes, Tornado codes, or chain reaction codes, to increase reliability. The basic idea is to send output symbols generated from the content instead of just the input symbols that constitute the content. Traditional erasure correcting codes, such as Reed-Solomon or Tornado codes, generate a fixed number of output symbols for a fixed length content. For example, for K input symbols, N output symbols might be generated. These N output symbols may comprise the K original input symbols and N-K redundant symbols. If storage permits, then the server can compute the set of output symbols for each content only once and transmit the output symbols using a carousel protocol.

One problem with some FEC codes is that they require excessive computing power or memory to operate. Another problem is that the number of output symbols must be determined in advance of the coding process. This can lead to inefficiencies if the loss rate of packets is overestimated, and can lead to failure if the loss rate of packets is underestimated.

For traditional FEC codes, the number of possible output symbols that can be generated is of the same order of magnitude as the number of input symbols the content is partitioned into. Typically, but not exclusively, most or all of these output symbols are generated in a preprocessing step before the sending step. These output symbols have the property that all the input symbols can be regenerated from any subset of the output symbols equal in length to the original content or slightly longer in length than the original content.

"Chain Reaction Coding" as described in U.S. Pat. No. 6,307,487 entitled "Information Additive Code Generator and Decoder for Communication Systems" (hereinafter "Luby I") and in U.S. patent application Ser. No. 10/032,156 entitled "Multi-Stage Code Generator and Decoder for Communication Systems" (hereinafter "Raptor") represents a different form of forward error-correction that addresses the above issues. For chain reaction codes, the pool of possible output symbols that can be generated is orders of magnitude larger than the number of the input symbols, and a random output symbol from the pool of possibilities can be generated very quickly. For chain reaction codes, the output symbols can be generated on the fly on an as needed basis concurrent with the sending step. Chain reaction codes have the property that all input symbols of the content can be regenerated from any subset of a set of randomly generated output symbols slightly longer in length than the original content.

Other descriptions of various chain reaction coding systems can be found in documents such as U.S. patent application Ser. No. 09/668,452, filed Sep. 22, 2000 and entitled "On Demand Encoding With a Window" and U.S. patent application Ser. No. 09/691,735, filed Oct. 18, 2000 and entitled "Generating High Weight Output symbols Using a Basis."

Some embodiments of a chain reaction coding system consist of an encoder, and a decoder. Data may be presented to the encoder in the form of a block, or a stream, and the encoder may generate output symbols from the block or the stream on the fly. In some embodiments, for example those described in Raptor, data may be pre-encoded off-line using a static encoder, and the output symbols may be generated from the plurality of the original data symbols and the static output symbols.

In some embodiments of a chain reaction coding system, the encoding and the decoding process rely on a weight table. The weight table describes a probability distribution on the set of source symbols. That is, for any number W between 1 and the number of source symbols, the weight table indicates a unique probability P(W). It is possible that P(W) is zero for substantially many values of W, in which case it may be desirable to include only those weights W for which P(W) is not zero.

In some embodiments of a chain reaction coding system the output symbols are generated as follows: for every output symbol a key is randomly generated. Based on the key, a weight W is computed from the weight table. Then a random subset of W source symbols is chosen. The output symbol will then be the XOR of these source symbols. These source symbols are called the neighbors or associates of the output symbol hereinafter. Various modifications and extensions of this basic scheme are possible and have been discussed in the above-mentioned patents and patent applications.

Once an output symbol has been generated, it may be sent to the intended recipients along with its key, or an indication of how the key may be regenerated. In some embodiments, many output symbols may make up one transmission packet, as for example described in the U.S. patent application Ser. No. 09/792,364, filed Feb. 22, 2001 and entitled "Scheduling of multiple files for serving on a server."

In certain applications it may be preferable to transmit the source symbols first, and then to continue transmission by sending output symbols. Such a coding system is referred to herein as a systematic coding system. On the receiving side, the receiver may try to receive as many original input symbols as possible, replace the input symbols not received by one or more output symbols and use them to recover the missing input symbols. The transmission of output symbols may be done proactively, without an explicit request of the receiver, or reactively, i.e., in response to an explicit request by the receiver. For example, for applications where no loss or a very small amount of loss is anticipated, it might be advantageous to send the original input symbols first, and to send additional output symbols only in case of erasures. This way, no decoding needs to be performed if there were no losses. As another application, consider the transmission of a live video stream to one or more recipients. Where there is expectation of some loss, it may be advantageous to protect the data using chain reaction coding. Because of the nature of a live transmission, the receiver may be able to buffer a specific part of the data only for at most a predetermined amount of time. If the number of symbols received after this amount of time is not sufficient for complete reconstruction of data, it may be advantageous in certain applications to forward the parts of the data received so far to the video player. In certain applications, and where appropriate source coding methods are used, the video player may be able to play back the data in a degraded quality. In general, where applications may be able to utilize even partially recovered data, it may be advantageous to use a systematic coding system.

Straightforward modifications of embodiments of chain reaction coding systems as described in Luby I or Raptor to produce systematic coding systems generally leads to inefficiencies. For example, if in a chain reaction coding system the first transmitted symbols comprise the original symbols, then it may be necessary to receive a number of pure output symbols which is of the same order of magnitude as the original symbols in order to be able to recover the original data. In other words, reception of the original symbols may only minimally help the decoding process, so that the decoding process has to rely entirely on the other received symbols. This leads to an unnecessarily high reception overhead.

What is therefore needed is a systematic version of a chain reaction coding system, which has efficient encoding and decoding algorithms, and has a similar reception overhead as a chain reaction coding system.

SUMMARY OF THE INVENTION

The present invention provides systems and methods for encoding and decoding data using systematic chain reaction encoding and decoding processes. These present can be used in numerous applications, one being a data communication system in which data is communicated faster, more reliably, and with less computational expense.

In one embodiment of the present invention, a method of encoding data into a chain reaction code is presented. Initially a set of input symbols is generated from the data. Subsequently, one or more non-systematic output symbols are generated from the set of input symbols, each of the one or more non-systematic output symbols being selected from an alphabet of non-systematic output symbols, and each non-systematic output symbols generated as a function of one or more of the input symbols. As a result of this encoding process, any subset of the set of input symbols is recoverable from (i) a predetermined number of non-systematic output symbols, or (ii) a combination of (a) input symbols which are not included in the subset of input symbols that are to be recovered, and (b) one or more of the non-systematic output symbols.

Additional embodiments and features of the invention will be better understood in view of the following drawings and detailed description.

BRIEF DESCRIPTION OF THE DRAWINGS

FIG. 4 illustrates a decoding matrix for the decoding graph shown in FIG. 3.

Figure 1A:
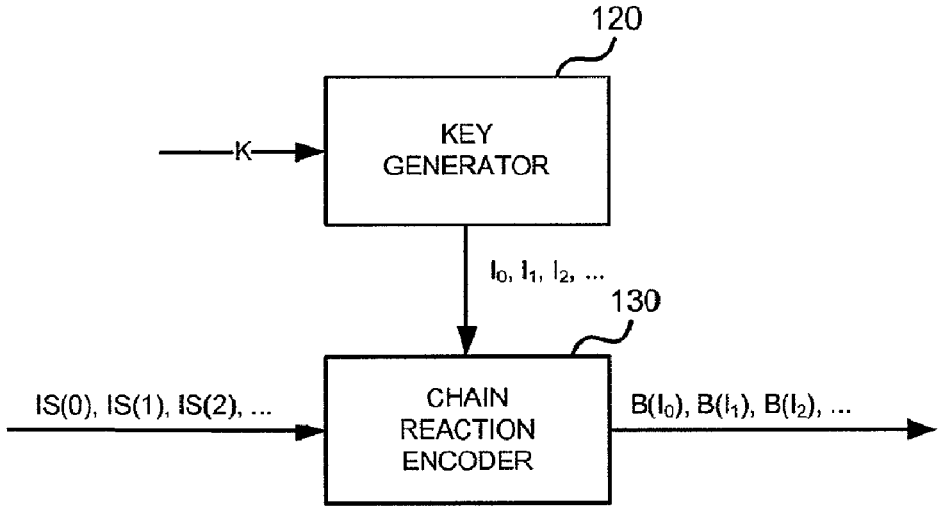
FIGS. 1A and 1B illustrate exemplary embodiments of a non-systematic chain reaction encoder and decoder, respectively.

For clarity and convenience, features and components which are identified in earlier drawings retain their reference numerals in subsequent drawings.

DETAILED DESCRIPTION OF EXEMPLARY EMBODIMENTS

I. Non-Systematic Chain Reaction Encoder & Decoder

Figure 1B:
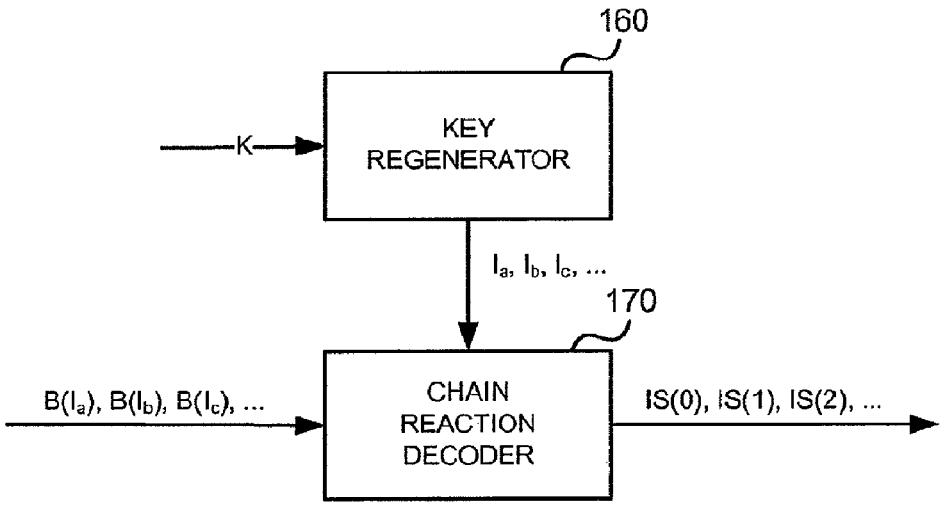

FIGS. 1A and 1B depict exemplary embodiments of a non-systematic chain reaction encoder 130 and decoder 170, respectively, as described in Luby I and Raptor. While not referred to as such in Luby I and Raptor, these embodiments are referred to herein as "non-systematic" to differentiate their architecture and operation from the systematic encoders and decoders presented below.

Referring now to FIG. 1A, the non-systematic encoder 130 accepts as input symbols IS(0), IS(1), . . . , and keys $I_0$, $I_1$, . . . generated by key generator 120. The number of input symbols may or may not be known in advance. In some embodiments, the non-systematic encoder 130 generates for each key I an output symbol. In FIG. 1A the output are denoted $B(I_0)$, $B(I_1)$, . . . corresponding to the keys $I_0$, $I_1$, . . . . The number of generated output symbols is potentially limitless. Key generator 120 may have access to a random number generator from which it generates the keys. Alternatively, the keys I may be generated by some other mechanism. Encoder 130 may include static and dynamic encoders, as described for example in Raptor. It may have access to an additional key generator used to describe a static encoder.

Figure 2:
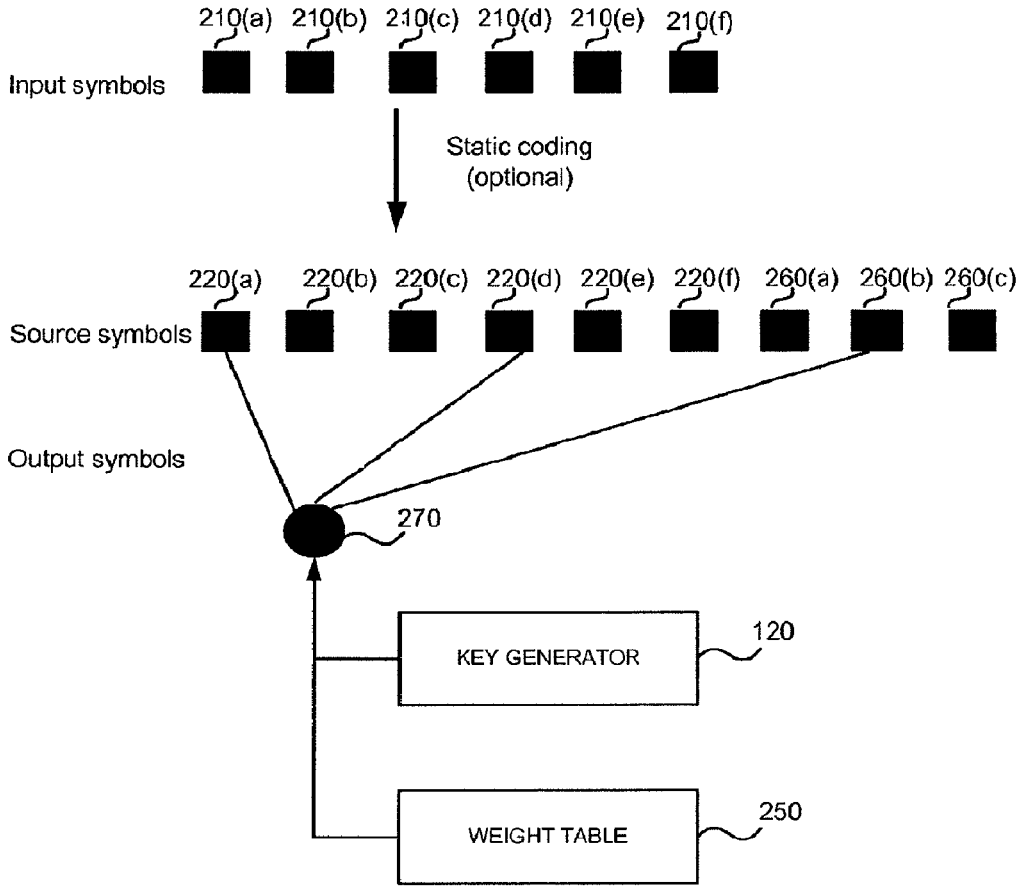
FIG. 2 illustrates the generation of an output symbol from the original input symbols used in the chain reaction decoding process.

There are various methods for obtaining the output symbols from the input symbols for which reference is made to Luby I and Raptor. One illustrative embodiment of such an encoding method is given in FIG. 2. It describes the generation of an output symbol 270 from the original input symbols. The original input symbols are denoted 210(*a*)-210(*f*). In some embodiments the first step of the coding process is static encoding, as described in Raptor. This step may produce the source symbols, denoted 220(*a*)-220(*f*), and 260(*a*)-260(*c*). In some embodiments, static encoding may be systematic, so that the values of the source symbols 220(*a*)-220(*f*) are equal to those of 210(*a*)-210(*f*). In some embodiments, there may be no static encoding, in which case the input symbols coincide with the source symbols. The source symbols can be produced off-line, or on-line, as the data symbols become available.

Once the source symbols have been created, the output symbols are generated from the source symbols. In some embodiments, the output symbol's value is the XOR of the values of some of the source symbols. For each output symbol, key generator 120 produces a key, from which the weight of the output symbol is determined from a weight table 250. Once the weight W is determined, W random or pseudorandom source symbols are chosen, and the value of the output symbol is computed as the XOR of the values of these source symbols. For example, in FIG. 2, the weight of the output symbol 270 is equal to 3 and its value is determined as the XOR of the source symbols 220(*a*), 220(*d*), and 260(*b*). The weight of an output symbol will also sometimes be referred to as the degree of the output symbol in this document. If a source symbol S contributes to the value of an output symbol O, then S and O are called neighbors. For example, in the situation depicted in FIG. 2 the output symbol 270 is a neighbor of each of the source symbols 220(*a*), 220(*b*), and 220(*d*).

Various embodiments of the chain reaction decoder 170 of FIG. 1B are described in detail in Luby I and Raptor. In some embodiments the decoding process starts as soon as enough output symbols have been collected. In some embodiments the number of collected output symbols is slightly larger than the number of original input symbols. In other embodiments, the number of collected output symbols needed to start the decoding process can be significantly smaller than the number of original input symbols.

In some embodiments, for each received output symbol key regenerator 160 calculates the corresponding key for the symbol, and from the key determines the neighboring source symbols.

Figure 3:
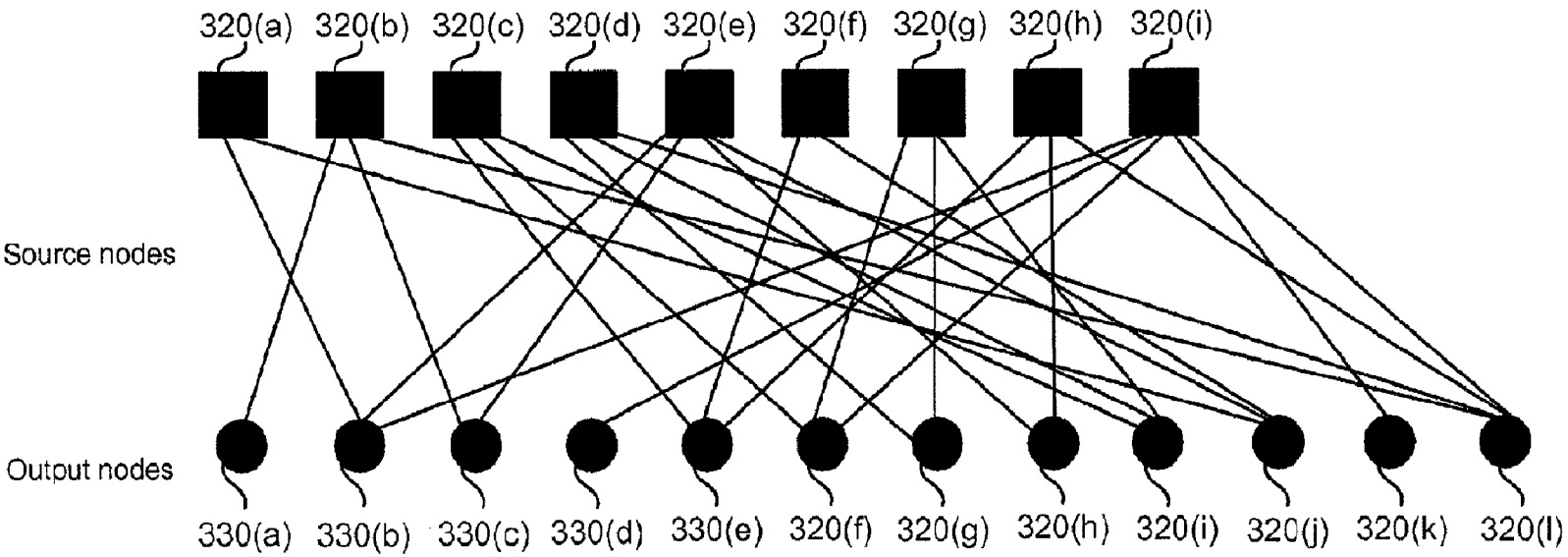
FIG. 3 illustrates an exemplary decoding graph used in the chain reaction decoding process.

One possible description of an embodiment of a decoding process for a chain reaction decoding can be described in terms of the corresponding Decoding Graph, as exemplified in FIG. 3. This graph consists of two sets of nodes, the source nodes, and the output nodes, corresponding to the source symbols and to the received output symbols, respectively. The source nodes correspond to the source symbols, and similarly the output nodes correspond to output symbols. An output node is connected to a source node if the source symbol corresponding to the source node is a neighbor of the output symbol corresponding to the output node. In this case said output node and said source node are called neighbors.

In some embodiments the decoding starts by identifying an output node $O_1$ of degree one. Then the unique neighbor of $O_1$ is declared recovered and is removed from the Decoding Graph, and the process is continued by identifying another output node $O_2$ of degree one. For example, in the situation depicted in FIG. 3, $O_1$ could be the output node denoted 330(*a*). Removal of its unique neighbor, 320(*b*), from the Decoding Graph, leads to another output node of degree one, namely 330(*c*). The process continues until all the source nodes are recovered, or until there are no output node of degree one left.

For example, in the situation of FIG. 3, the following sequence of output nodes may be chosen to recover the corresponding source nodes:

| Output node | Recovered source node |
|---|---|
| 330(a) | 320(b) |
| 330(c) | 320(e) |
| 330(h) | 320(h) |
| 330(d) | 320(i) |
| 330(b) | 320(a) |
| 330(j) | 320(f) |
| 330(e) | 320(c) |
| 330(f) | 320(g) |
| 330(g) | 320(d) |

In this case decoding is successful.

In some embodiments, the graph interpretation may be used to set up a schedule for the actual computations required for the decoding, as illustrated in Luby I or Raptor. Moreover, the idealized decoder described above may be changed in a variety of ways to reduce the resources required, and to speed up the decoding process, as described in the above mentioned patents and patent applications.

In some embodiments, the decoder may output the sequence of output nodes that were used to recover the corresponding input nodes. For example, in the case outlined above, the decoder may output the indices corresponding to the output nodes 330(*a*), 330(*c*), 330(*h*), 330(*d*), 330(*i*), 330(*b*), 330(*j*), 330(*e*), 330(*f*), and 330(*g*).

It is sometimes advantageous to consider a matrix representation of the Decoding Graph, and an interpretation of the decoding algorithm in terms of this matrix, called the Decoding Matrix hereinafter. In some embodiments of the present invention the Decoding Matrix corresponding to the Decoding Graph has as many rows as there are output nodes, and as many columns as there are source nodes, and has entries 0 or 1. There is a 1 at position (k,j) of the Decoding Matrix if the j-th source node is a neighbor of the k-th output node.

FIG. 4 is an illustration of the Decoding Matrix for the Decoding Graph of FIG. 3. As is known to those skilled in the art, the decoding problem can be phrased in terms of solving a system of equations given by the Decoding Matrix. If M denotes the Decoding Matrix corresponding to the Decoding, and if the vector of values of the output symbols is denoted by b, and if there are K source nodes, then the unknown source symbol values $x_1, x_2, \ldots, x_K$ satisfy the matrix equation:

$$M \cdot x = b,$$

where x is the column vector $(x_1, x_2, \ldots, x_K)$. The chain reaction decoding is successful if there is a permutation of rows and columns of M such that the resulting matrix is a lower triangular matrix, i.e., such that the values in the matrix above the main diagonal are zero. For example, by performing the permutation (3→2, 8→3, 2→5, 10→6, 5→7, 6→8, 7→9) on the rows, and the permutation (2→1, 5→2, 8→3, 9→4, 1→5, 3→7, 7→8, 4→9) on the columns of M a lower triangular matrix is produced. Stated in terms of matrices, this means that the chain reaction decoding algorithm produces permutation matrices P and Q such that P·M·Q is a lower triangular matrix. There are various methods for solving a system of linear equations, as is known to those of skill in the art. For example, it is possible to use the Gaussian elimination algorithm.

The matrix view of the decoding is for illustrative purposes only and not restrictive. In particular, the actual operations of the decoder may differ substantially from the preceding discussions, as described in Luby I, Raptor, and the above mentioned patent applications.

In some embodiments, if a multi-stage chain reaction coding system is used, as described in Raptor, the Decoding Graph may be augmented by a secondary graph which describes the relationship among the source symbols given by the particular static encoding used. For example, where a low-density parity-check code is used for the static encoding process, then a number of output nodes equal to the number of check symbols in this code may be added to the Decoding Graph, their value set to 0, and the Decoding Graph may be augmented by the graph of the low-density parity-check code between the source nodes and the check nodes, and the Decoding Graph may be replaced by the new graph. The choice of low-density parity-check codes is not essential to this application. In general, for any type of static encoding, the corresponding parity-check matrix defines a bipartite graph by which the Decoding Graph may be augmented. This new graph will be referred to as the Modified Decoding Graph hereinafter.

Figure 5:
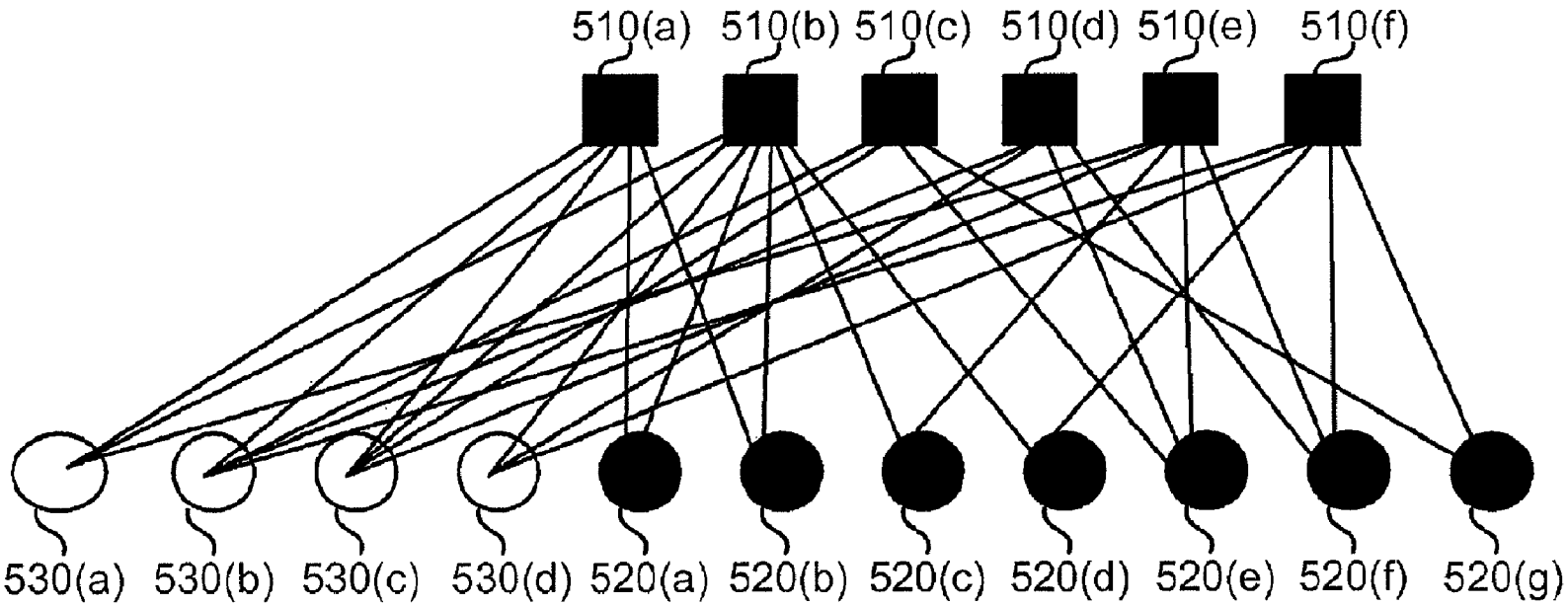
FIG. 5 illustrates an exemplary procedure for obtaining a modified decoding graph used in the chain reaction decoding process.

FIG. 5 is an illustrative embodiment of a procedure for obtaining the Modified Decoding Graph. The source nodes are denoted 510(*a*)-510(*f*), the output nodes are denoted 520(*a*)-520(*g*), and the check nodes are denoted 530(*a*)-530(*d*). The source nodes correspond to the source symbols. The graph between the output nodes and the source nodes is the Decoding Graph, given by the neighborhood structure of the output nodes. The graph between the check nodes and the source nodes describes the relations among the source nodes. For example, node 530(*a*) shows that the XOR of the values of the source symbols corresponding to source nodes 510(*a*), 510(*b*), 510(*e*), and 510(*f*) is zero.

Figure 6:
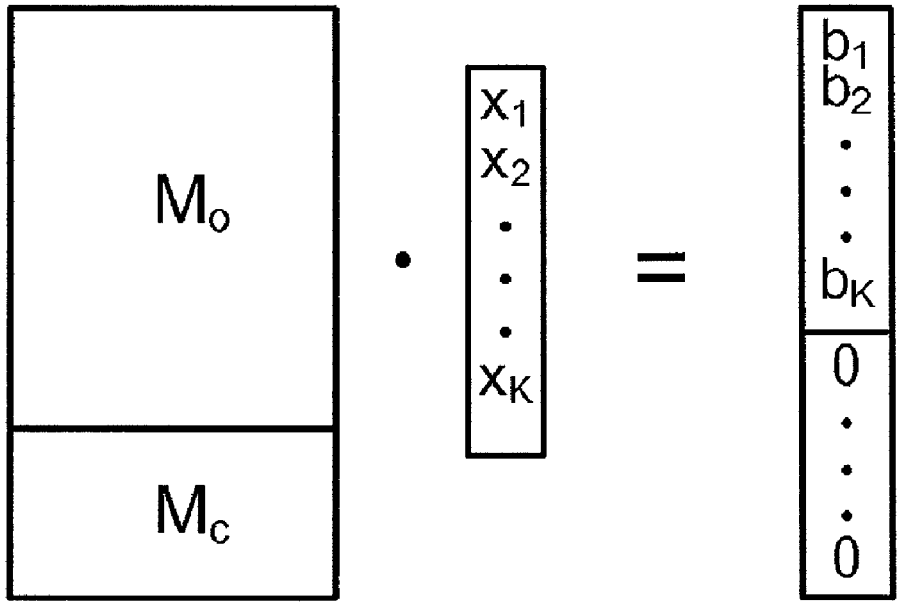
FIG. 6 illustrates a modified decoding equation used in the chain reaction decoding process.

To the Modified Decoding Graph corresponds a Modified Decoding Matrix consisting of zeros and ones, which has as many columns as there are source nodes, and as many rows as the aggregate value of output nodes and check nodes. Correspondingly, the Modified Decoding Matrix consists of two sets of rows, one corresponding to the output nodes, and one corresponding to the check nodes. Where there are L output nodes, C check nodes, and K source nodes, the Modified Decoding Matrix may be decomposed into a submatrix $M_o$ consisting of L rows and K columns, and a matrix $M_c$ consisting of C rows and K columns. If $x_1, \ldots, x_K$ denote the unknown values of the source symbols, and $b_1, \ldots, b_L$ denote the known values of the received output symbols, the task of the decoder may be to solve the system of equations given by $M_o \cdot x = b$, and $M_c \cdot x = 0$. The combined system of equations would be the one given in FIG. 6.

In some embodiments of a chain reaction decoder a different decoder, called an Inactivation Decoder, may be used. This Decoder is described in greater detail in the commonly assigned co-pending U.S. patent application Ser. No. 10/459,370, entitled "Systems and Process for Decoding a Chain Reaction Code through Inactivation," herein incorporated by reference, and referred to as the "Inactivation Decoder."

II. Systematic Chain Reaction Encoder & Decoder and Methods of Operation

Figure 7A:
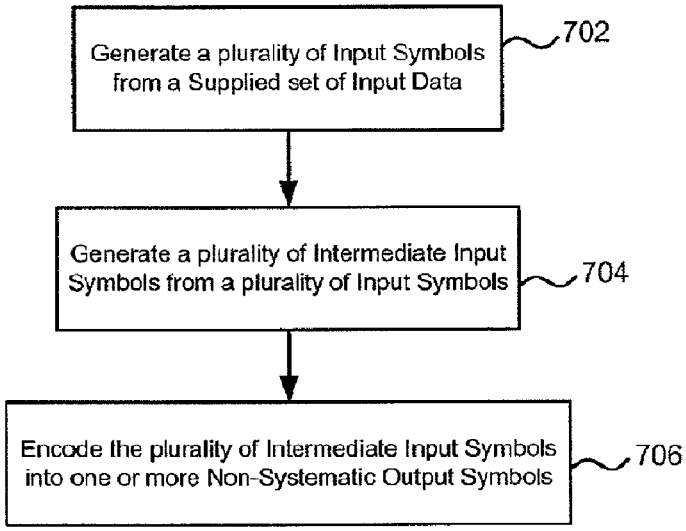
FIG. 7A illustrates an exemplary method for encoding data using systematic chain reaction codes in accordance with the present invention.

FIG. 7A illustrates an exemplary method for encoding data using systematic chain reaction codes in accordance with the present invention. As used herein, the term "output symbol(s)" refers to a chain reaction code, examples of which are described in Luby I and Raptor. Systematic and non-systematic output symbols are, accordingly, specific types of chain reaction codes, a systematic output symbol comprising a transmitted input symbol, and a non-systematic output symbol comprising a output symbols which is a function of one or more input symbols.

The method of FIG. 7A may be used for a variety of applications, such as encoding data for transmission across a real-time channel, such as a path through the Internet or a broadcast link from a television transmitter to a television recipient or a telephone connection from one point to another, or the communications channel can be a storage channel, such as one or multiple CD-ROMs, disk drives, Web sites, or the like. The communications channel might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Referring now to FIG. 7A, the encoding process begins at 702 when a set of input data is received, and a set of input symbols is generated therefrom. Exemplary embodiments of this process are described in Luby I and Raptor, although other techniques may be used in alternative embodiments under the present invention. As described in this document and those referred to or incorporated herein by reference, the input data may be of any format and type, including live data in which the entire set is not known a priori.

Next, one or more non-systematic output symbols are generated from the input symbols. In a particular embodiment of that process, intermediate input symbols are initially generated from the input symbols (704). Subsequently, one or more non-systematic output symbols are generated from the intermediate input symbols (706). In alternative embodiments under the invention, the process of 706 may be omitted and the non-systematic output symbols are generated from the input symbols. Each of these processes are illustrated in greater detail below.

As will be further described below, the input symbols are provided by an input symbol generator for the input data. As explained above, the input data may be data obtained in real-time from a secondary device, such as a video capture module, or it can be static, for example when the input data resides in a file or a buffer created by a secondary application. In other applications of the present invention the input data may be acquired by a combination of a real-time and a static method, for example by receiving the data from a secondary device or application, such as a network card, and storing it on a storage device for further processing by the input symbol generator.

Figure 7B:
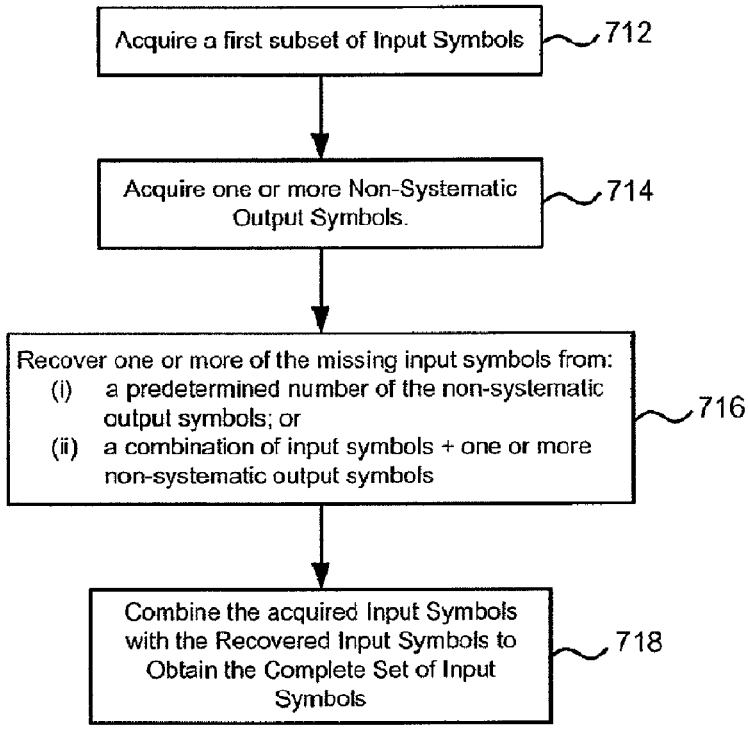
FIG. 7B illustrates an exemplary method for decoding systematic chain reaction codes in accordance with the present invention.

FIG. 7B illustrates an exemplary method for decoding systematic chain reaction codes in accordance with the present invention. Initially at 712, a first subset of the input symbols is acquired. The application will ordinarily determine how this process is accomplished. For instance, when used in a communication system, this process is performed by receiving input symbols of a chain reaction codes transmitted across a communication channel. As explained above, in particular embodiments of the present invention a communications channel can be a real-time channel, or it can be a storage channel, a combination thereof. In a particular embodiment further illustrated below, acquisition of the input symbols is accomplished by transmitting the input symbols to a receiver, the transmitted input symbols comprising systematic output symbols. Because of expected channel losses, some of the transmitted input symbols (i.e., the systematic output symbols) may be lost. Accordingly, only a subset of the original set of input symbols may be acquired by the receiver.

Next at 714, one or more non-systematic output symbols are acquired. Typically, the acquisition of the non-systematic output symbols will follow the same modality as the input symbols, although other means may be used in alternative embodiments.

The method continues at 716, where one or more of the input symbols which were not acquired, are recovered. In a specific embodiment of this process, the missing input symbols may be recovered either from the non-systematic output symbols, or from a combination of non-systematic output symbols and the acquired input symbols.

The recovery process at 716 may be used to recover one, several, or all of the missing input symbols. Once the desired number of missing input symbols is recovered, they may be added to the acquired input symbols to re-form the original set of input symbols, and accordingly, a copy of the original data.

Figure 7C:
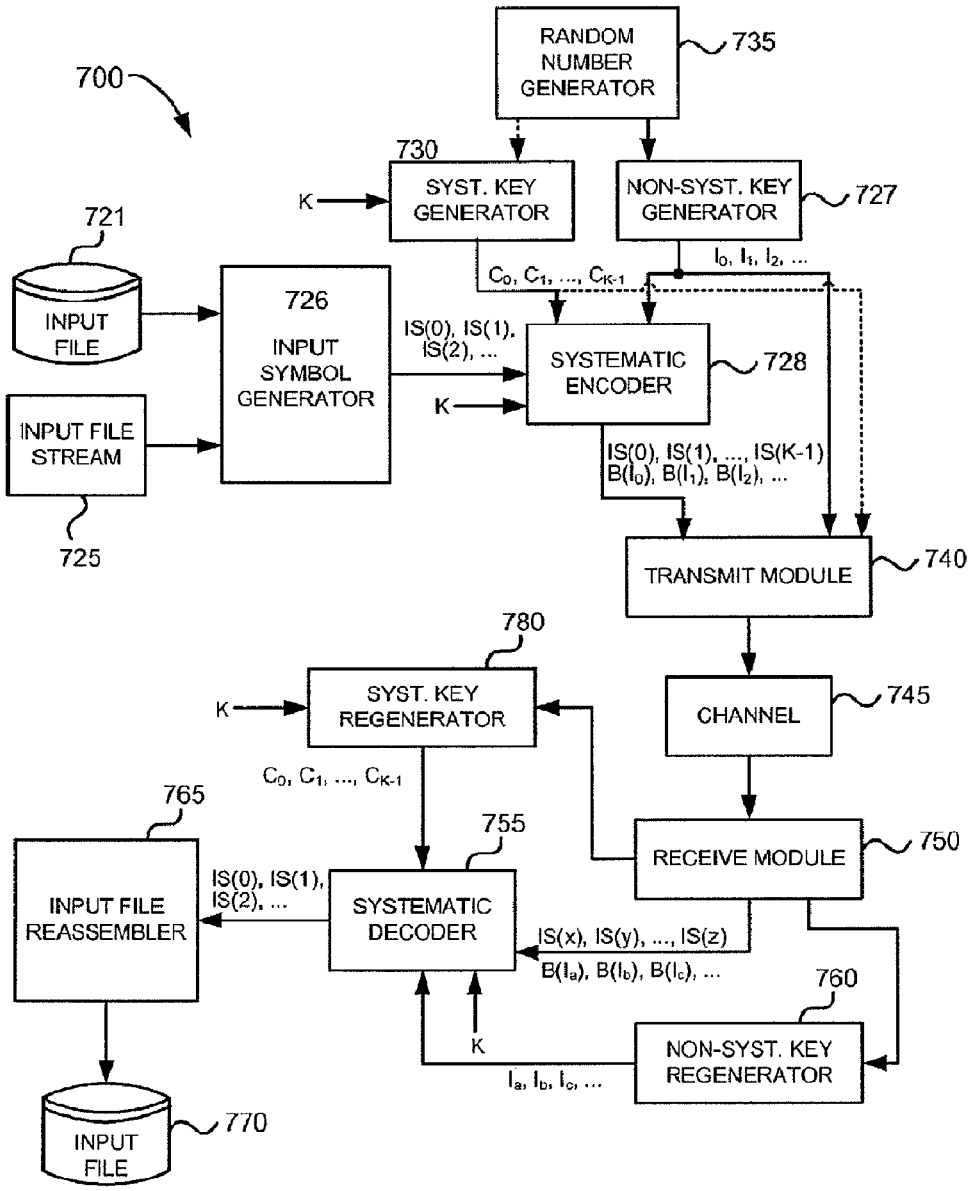
FIG. 7C illustrates a block diagram of a communications system employing systematic coding and decoding in accordance with one embodiment of the present invention.

FIG. 7C is a block diagram of an exemplary communications system 700 that uses systematic coding and decoding in accordance with one embodiment of the present invention. In the communication system 700, an input file 721, or an input stream 725, is provided to an input symbol generator 726. Input symbol generator 726 generates a sequence of one or more input symbols (IS(0), IS(1), IS(2), . . . ) from the input file or stream, with each input symbol having a value and a position (denoted in FIG. 7 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 700, but a general purpose system might include a symbol size input for input symbol generator 726 so that M can be varied from use to use. The output of input symbol generator 726 is provided to a systematic encoder 728.

The non-systematic key generator 727 generates keys $I_0$, $I_1$, $I_2$, . . . corresponding to the input symbols provided to the encoder 728, the non-systematic keys being used to compute the values of the non-systematic output symbols $B(I_0)$, $B(I_1)$, $B(I_2)$, . . . output from the encoder 728. Each non-systematic key $I_0$, $I_1$, $I_2$, . . . is generated so that a large fraction of the keys for the same input file are unique. In one embodiment, the non-systematic key generator 727 comprises the key regenerator 120 illustrated in FIG. 1A above and described in Luby I and Raptor, although in other embodiments another type of device operable to generate non-systematic keys may be used.

Systematic key generator 730 generates systematic keys $C_0$, $C_1$, $C_2$, . . . corresponding to the input symbols provided to the encoder 728, these keys being used to recover one or more of the input symbols not received, as will be further described below. It may use random numbers generated by random number generator 735 to generate the keys. The generation of the systematic keys will be subsequently described in greater detail. The outputs of non-systematic key generator 727 and the systematic key generator 730 are provided to encoder 728.

From each non-systematic key I provided by the non-systematic key generator 727, encoder 728 generates a non-systematic output symbol, with a value B(I), from the input symbols provided by the input symbol generator. The non-systematic output symbol generated may be that as described in Luby I (single stage encoding/decoding) or the output symbol described in Raptor (multiple stage encoding/decoding). The operation of an exemplary systematic encoder 728 will be described in more detail below. The value of each output symbol is generated based on its key, and on some function of one or more of the input symbols.

In some embodiments, the number K of input symbols is used by the systematic encoder 728 to select the associates. If K is not known in advance, such as where the input is a streaming file, K can be just an estimate. The value K might also be used by systematic encoder 728 to allocate storage for input symbols and any intermediate symbols generated by systematic encoder 728.

Systematic encoder 728 forwards the input symbols IS(0), IS(1), . . . together with the systematic keys $C_0, C_1, \ldots, C_{K-1}$, or an indication on how to regenerate the systematic keys to transmit module 740. When transmitted, the symbols IS(0), IS(1), . . . are herein referred to as "systematic output symbols". Systematic encoder 728 may create a copy of the input symbols for the generation of further output symbols before forwarding the input symbols to the transmit module.

Systematic encoder 728 also provides the non-systematic output symbols $B(I_0)$, $B(I_1)$, $B(I_2)$, . . . to transmit module 740. Transmit module 740 is also provided the non-systematic keys ($I_0$, $I_1$, $I_2$, . . . ) for each such output symbol from the non-systematic key generator 727. Transmit module 740 transmits the systematic and non-systematic output symbols, and depending on the keying method used, transmit module 740 might also transmit some data about the keys of the transmitted output symbols, over a channel 745 to a receive module 750. Channel 745 is assumed to be an erasure channel, but that is not a requirement for proper operation of communication system 700. Modules 740, 745 and 750 can be any suitable hardware components, software components, physical media, or any combination thereof, so long as transmit module 740 is adapted to transmit output symbols and any needed data about their keys to channel 745 and receive module 750 is adapted to receive symbols and potentially some data about their keys from channel 745. The value of K, if used to determine the associates, can be sent over channel 745, or it may be set ahead of time by agreement of encoder 728 and decoder 755.

As explained above, channel 745 can be a real-time channel, such as a path through the Internet or a broadcast link from a television transmitter to a television recipient or a telephone connection from one point to another, or channel 745 can be a storage channel, such as a CD-ROM, disk drive, Web site, or the like. Channel 745 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Receive module 750 receives the non-systematic and/or systematic output symbols from the channel 745 which it supplies to a decoder 755. Data corresponding to the keys of the received output symbols are provided to the non-systematic key regenerator 760, and the systematic key regenerator 780. In the illustrated embodiment of FIG. 7, a set of systematic output symbols denoted by IS(x), IS(y), . . . , IS(z) is received along with a set of non-systematic output symbols $B(I_a)$, $B(I_b)$, $B(I_c)$, . . . In alternative embodiments, the receive module 750 may receive systematic output symbols exclusively, or a combination of systematic and non-systematic output symbols.

The non-systematic key regenerator 760 regenerates the non-systematic keys for the received non-systematic output symbols and provides these keys to the systematic decoder 755. In one embodiment, the non-systematic key regenerator 760 comprises the key regenerator 160 illustrated in FIG. 1B above and described in Luby I and Raptor, although in other embodiments another type of device operable to regenerate non-systematic keys may be used. Systematic key regenerator 180 regenerates the systematic keys $C_0$, $C_1$, . . . and provides them to the systematic decoder 755. The systematic key regenerator 780 may have access to some shared information with the systematic key generator 730 which facilitates the regeneration of the systematic keys. Alternatively, systematic key regenerator 780 may regenerate the keys based on additional information transmitted through channel 745. In some embodiments, systematic key regenerator 780 may have access to the same random number generator 735 which may be used to generate the systematic keys. This can be in the form of access to the same physical device if the random numbers are generated on such device, or in the form of access to the same algorithm for the generation of random numbers to achieve identical behavior.

Decoder 755 uses the non-systematic keys provided by non-systematic key regenerator 760 and systematic key generator 780 together with the corresponding output symbols, to recover the input symbols (again IS(0), IS(1), IS(2), . . . ). The recovered input symbols are forwarded to the input file reassembler 765. Systematic decoder 755 may forward the received systematic output symbols IS(x), IS(y), . . . , IS(z) directly to the input file reassembler 765, before recovering the remaining input symbols. In particular, if all input symbols are received, the decoder may choose to just forward the received data to input file reassembler without further computation. Input file reassembler 765 generates a copy 770 of input file 721 or input stream 725.

In the following the operations of the systematic encoder 728 and decoder 755 will be described in greater detail. In some embodiments of the present invention these units may use chain reaction encoding and decoding, as described above.

Figure 8A:
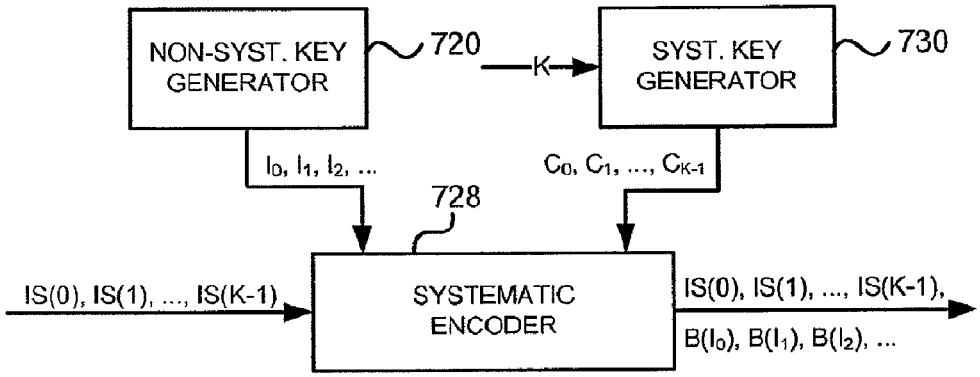
FIG. 8A illustrates the operation of the systematic encoder in accordance with one embodiment of the present invention.

FIG. 8A illustrates the operation of the systematic encoder 728 in a specific embodiment of the invention. Initially, the systematic encoder 728 receives the input symbols IS(0), IS(1), . . . , IS(K−1) from input symbol generator 726 in FIG. 7. The input symbols may be known in their entirety at the start of the encoding, or they may only be partially known.

In this embodiment, the systematic encoder 728 has access to the non-systematic key generator 727, which generates as many non-systematic keys $I_0$,$I_1$, . . . as the number of non-systematic output symbols generated. In addition, the systematic key generator 730 generates as many systematic keys $C_0$, $C_1$, . . . , $C_{K-1}$ as there are input symbols. Systematic Encoder 728 passes the original input symbols to the transmit module 750, these symbols being transmitted as the systematic output symbols. The systematic encoder 728 also operates to generate non-systematic output symbols $B(I_0)$, $B(I_1)$, . . . for each of the keys $I_0$, $I_1$, . . . generated by non-systematic key generator 727. The operation of the systematic key generator 730 is further described below.

Systematic key generator 730 and systematic key regenerator 780 (FIG. 7) may have access to some shared information so systematic key regenerator 780 can succeed in generating the same keys as the systematic key generator 730. In some embodiments the shared information may be transmitted to the systematic key regenerator 780. In other embodiments the systematic keys may be a deterministic function of other parameters of the code, e.g., the number of input symbols and the weight table.

In some embodiments, the systematic keys may have been pre-computed for some or all relevant values of the number of input symbols. In some embodiments, the systematic keys may be re-used for different sets of input symbols. In other embodiments, the systematic keys may be re-computed for every input block, using some shared information between the systematic key generator 730 and the systematic key regenerator 780.

Figure 8B:
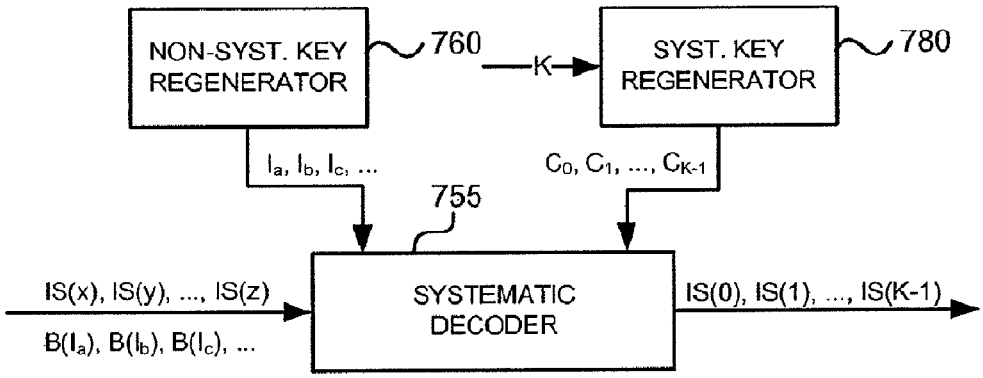
FIG. 8B illustrates the operation of the systematic decoder in accordance with one embodiment of the present invention.

FIG. 8B illustrates the operation of the systematic decoder 755 in a specific embodiment of the invention. Systematic decoder 755 receives systematic and non-systematic output symbols from receive module 750 denoted as IS(x), IS(y), . . . , IS(z), and $B(I_a)$, $B(I_b)$, . . . , respectively. In a particular embodiment, systematic decoder 755 has access to the systematic key regenerator 780, and to non-systematic key regenerator 760. The output of the systematic chain reaction decoder is the set of initial input symbols IS(0), IS(1), . . . , IS(K−1).

Figure 9A:
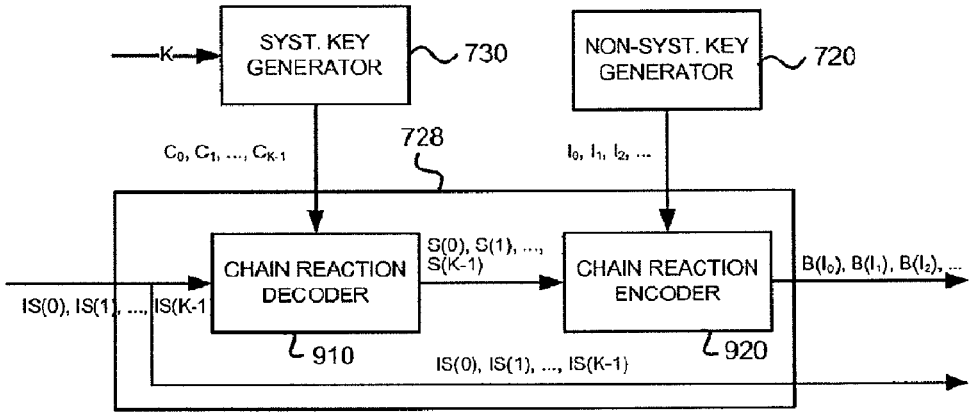
FIG. 9A illustrates one embodiment of the systematic encoder in accordance with the present invention.

FIG. 9A illustrates the systematic encoder 728 in more detail. The systematic encoder 728 includes a chain reaction decoder 910, and a chain reaction encoder 920. Additionally, it may have access to a memory device (not shown) to store intermediate symbols S(0), S(1), . . . , S(K−1).

Upon receiving the input symbols IS(0), IS(1), . . . , IS(K−1), and the systematic keys $C_0$, $C_1$, . . . , $C_{K-1}$, chain reaction decoder 910 computes a set of intermediate input symbols S(0), S(1), . . . , S(K−1) using, for example, the decoding methods for chain reaction codes described in the patents and patent applications incorporated herein. In some embodiments of the present invention the intermediate input symbols may be stored in memory, or on disk. In other embodiments, the intermediate input symbols may be forwarded to chain reaction encoder 920 as they become available.

Chain reaction encoder 920 uses the intermediate input symbols generated by chain reaction decoder 910 together with non-systematic keys $I_0$, $I_1$, $I_2$, . . . generated by non-systematic key regenerator 727, to generate non-systematic output symbols $B(I_0)$, $B(I_1)$, . . . . In some embodiments, this encoding process may be accomplished using the input symbol encoding process described in either Luby I or Raptor, with the modification that the intermediate input symbols of the present invention are used as the input symbols of Luby I. In a particular embodiment the non-systematic output symbols are supplied to the transmit module 140 after the input symbols IS(0), IS(1), . . . IS(K−1). This is however not essential for the functioning of this invention. Further, the order of transmission from the transmit module 740 may vary as well.

Figure 9B:
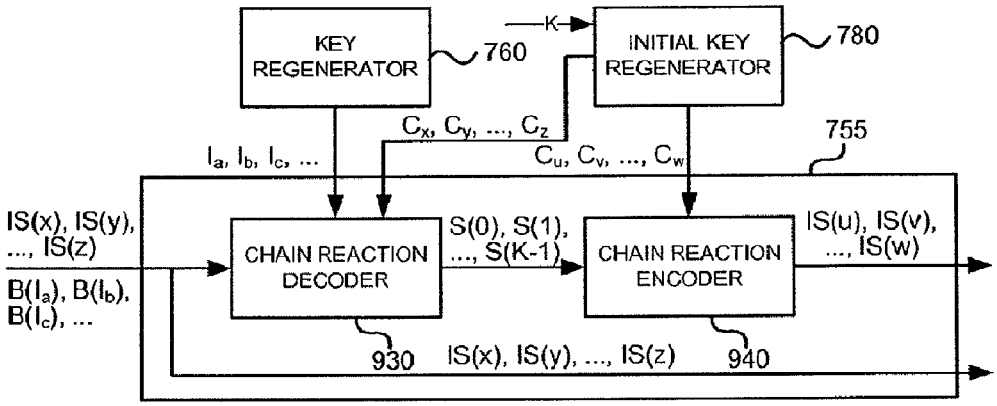
FIG. 9B illustrates one embodiment of the systematic decoder in accordance with the present invention.

FIG. 9B is an illustrative embodiment of the systematic decoder 755, which includes a chain reaction decoder 930, and a chain reaction encoder 940. The input to the systematic decoder includes the received output symbols some of which comprise the received systematic output symbols IS(x), IS(y), IS(z), . . . , and some of which may comprise received non-systematic output symbols $B(I_a)$, $B(I_b)$, . . . . In some embodiments, the decoder may copy the received systematic symbols to a memory device, and directly forward them to input file reassembler 765.

Chain reaction decoder 930 uses the symbols IS(x), IS(y), . . . , IS(z), $B(_a)$, $B(I_b)$, the systematic keys $C_x$, $C_y$, . . . , $C_z$, generated by the systematic key regenerator 780, and the non-systematic keys $I_a$, $I_b$, . . . generated by non-systematic key regenerator 760 to produce intermediate input symbols S(0), S(1), . . . , S(K−1). The systematic keys $C_x$, $C_y$, . . . , $C_z$, correspond to the received input symbols IS(x), IS(y), . . . , IS(z). In some embodiments, the recovered intermediate symbols may be stored to a secondary storage before being passed to the chain reaction encoder 440. In other embodiments, these intermediate symbols may be passed directly to the chain reaction encoder 940.

Chain reaction encoder 940 uses the intermediate input symbols and the systematic keys $C_u$, $C_v$, . . . $C_w$ corresponding to erased systematic output symbols IS(u), IS(v), . . . , IS(w) to generate and output the missing original input symbols IS(u), IS(v), . . . , IS(w). As an exemplary embodiment, for each of the initial keys $C_u$, $C_v$, . . . , $C_w$, the decoder identifies a weight W and W symbols among the intermediate input symbols S(0), . . . , S(K−1), and XOR's the values of output symbols to obtain the erased input symbols IS(u), IS(v), . . . , IS(w) corresponding to the systematic keys $C_u$, $C_v$, . . . , $C_w$. The amount of computational resources used by chain reaction encoder 940, in one embodiment, will be proportional to the number of systematic output symbols that are erased. For example, if all the systematic output symbols are received, then the decoder may not perform any computations, and forward the received symbols to input file reassembler 765.

In particular embodiments, the chain reaction encoder 940 and chain reaction decoder 910 will have access to the same weight table, and use the same static encoding/decoding, if static encoding is used. Similarly, chain reaction encoder 920 and chain reaction decoder 930 may have access to the same weight table, and use the same static encoding/decoding.

Methods for Calculating the Systematic Keys

In a specific embodiment of the present invention, the systematic keys are calculated by systematic key generator 730 before symbol transmission, and re-computed by the systematic key regenerator 780 after symbol reception. The systematic keys are used by the chain reaction decoder 910 and encoder 930 to obtain the intermediate input symbols S(0), S(1), . . . S(K−1).

In particular embodiments of the present invention the systematic keys are calculated in such a way that unique and efficient chain reaction decoding of K symbols is possible using exactly K output symbols generated with these keys. Here decoding can be any of the decoding methods described in Luby I, Raptor, or Inactivation Decoding, or more generally decoding methods based on the Gaussian elimination algorithm as for example described in Inactivation Decoding.

Figure 10:
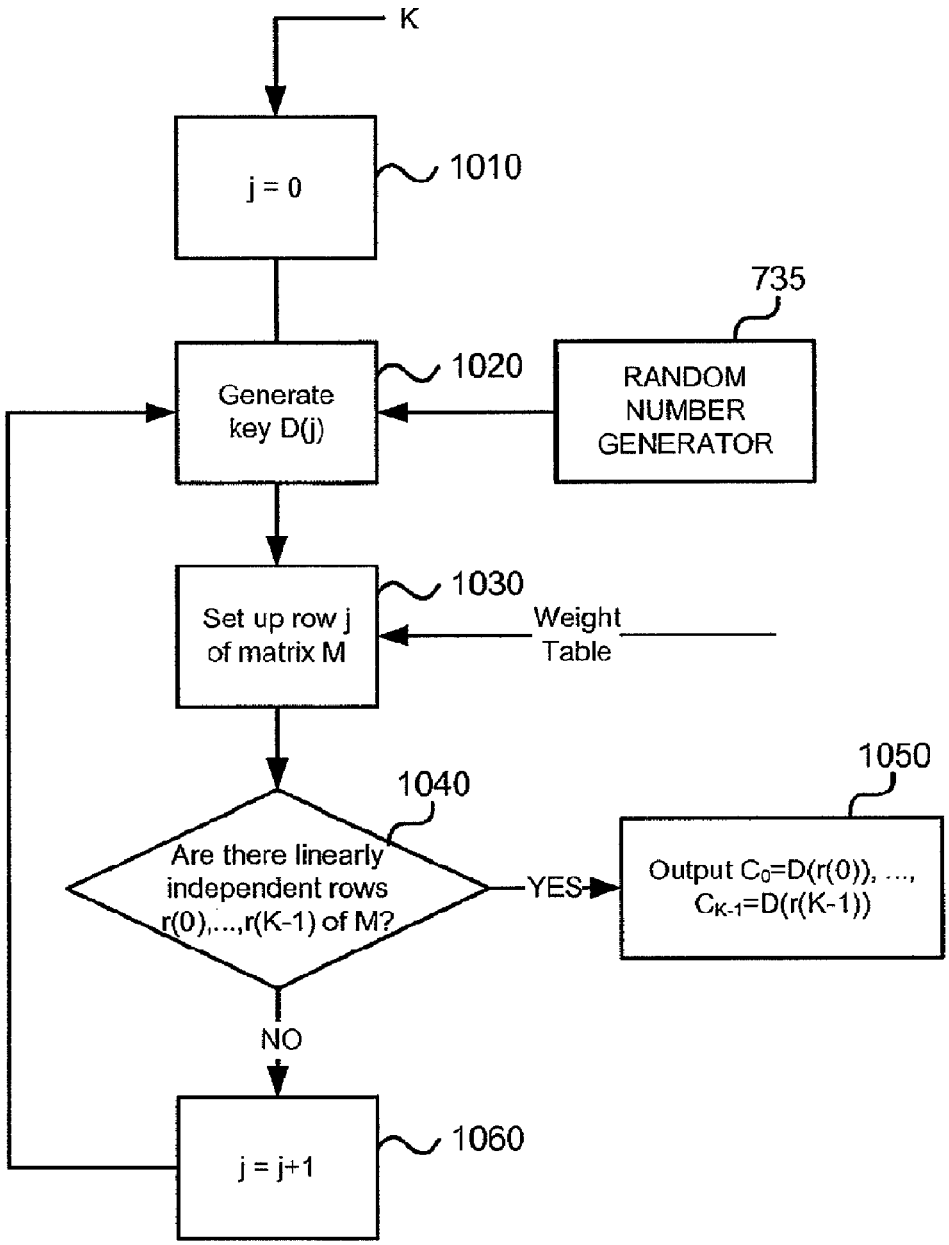
FIG. 10 illustrates one method for generating the systematic keys in accordance with the present invention.

FIG. 10 is an exemplary embodiment of the systematic key generation process. One input to the systematic key generator may be the number K of input symbols IS(0), IS(1), . . . , IS(K−1). Systematic key generation starts by setting a variable j equal to 0. During the algorithm a matrix M with K columns, which, initially, has zero rows, is updated by adding rows as the algorithm progresses. For every different value of j the algorithm generates a different key D(j) at 1020. This key may be generated by the methods described in Luby I or Raptor, and may use the random number generator 135 shown in FIG. 1. Next at 1030, the key D(j) is used to compute the entries of the j-th row of the matrix M. One possible embodiment of such a computation would be to use key D(j) in the chain reaction coding process. In this case, using the weight table, the key D(j) identifies a weight W and W values among the values 0, 1, . . . , K−1. It then may set a 1 at position m of the $j^{th}$ row of M if m is one of the random or pseudorandom values generated, and set the other values of the $j^{th}$ row to zero.

At 1040, a determination is made as to whether the presently configured matrix M has K rows that are linearly independent over the binary field GF(2), the binary filed GF(2) referring to the set consisting of 0 and 1 in which multiplication and addition are performed modulo the integer 2. This process in 1040 can be performed in a variety of ways. For example, Gaussian elimination over the binary field GF(2) could be used to check this. However, there are many other ways as known to those skilled in the art. For example, if the teachings of Inactivation Decoding are applied to the matrix M, then M contains K linearly independent rows only if the Inactivation Decoder applied to M is successful.

If the test in 1040 is positive, and rows r(0), r(1), . . . , r(K−1) of M are discovered to be linearly independent, then the systematic keys $C_0$, $C_1$, . . . , $C_{K-1}$ are set to the keys D(r(0)), . . . , D(r(K−1)), and the keys are output. If the test in 1040 is negative, then the counter j is incremented in 1060, and the computation is repeated from 1020 on.

Other equivalent or substantially similar methods of generating the systematic keys can be envisioned by those skilled in the art. For example, instead of generating the keys D(j) one at a time during the course of the algorithm, a set of L such keys could be generated beforehand, and key D(j) could be taken from this pool of keys at step j of the algorithm. Herein, L could be a function of the number of input symbols.

Figure 11:
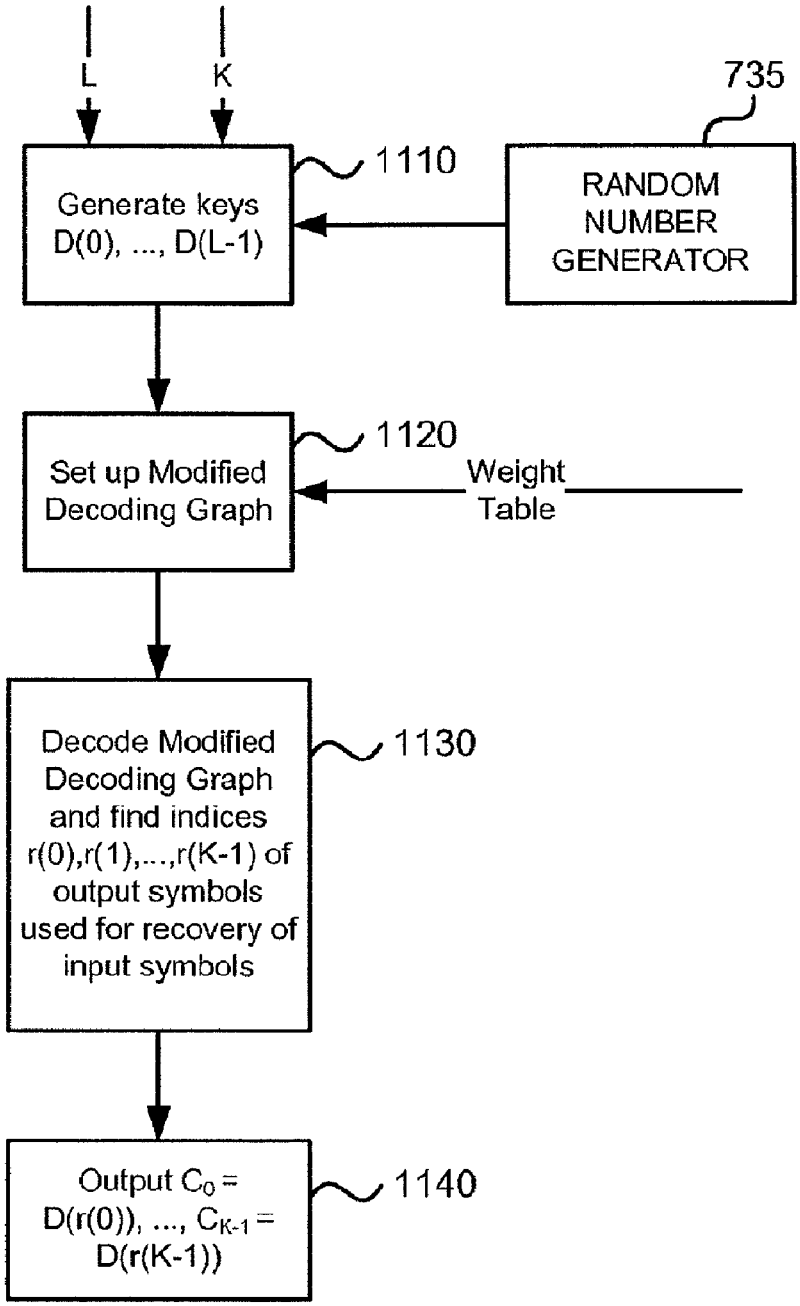
FIG. 11 illustrates a second method for generating the systematic keys in accordance with the present invention.

A second method for generating the systematic keys is exemplified in FIG. 11. In this method, the input to this algorithm consists of the number K of input symbols, and a number L which is typically larger than or equal to K. In some embodiments, L may be the number of output symbols to be collected to guarantee, with high probability, that the decoding is successful, as described in Luby I or Raptor.

At 1110, L keys D(0), . . . , D(L−1) are generated. This process may be accomplished through the use of a random number generator 735. In other embodiments, these keys may be generated from a fixed list of re-usable keys. This process may also provide an indication of how the keys were generated. For example, if a random number generator is used, the seed for the generator may be recorded for future use by the systematic key regenerator.

Using the keys D(0), D(1), . . . , D(L−1) a Modified Decoding Graph is set up in 1120 as described above and exemplified in FIG. 5. This process may employ the knowledge of the specific weight table for the code, as well as the knowledge of any static encoding used, as described in Raptor.

At 1130, the Modified Decoding Graph is decoded using any of the methods presented earlier. As a by-product of the decoding, the indices r(0), r(1), . . . , r(K−1) of those output nodes that trigger the recovery of an input node are recorded. At 1140, the systematic keys are outputted as $C_1$=D(r(0)), . . . , $C_K$=D(r(K−1)).

Figure 12:
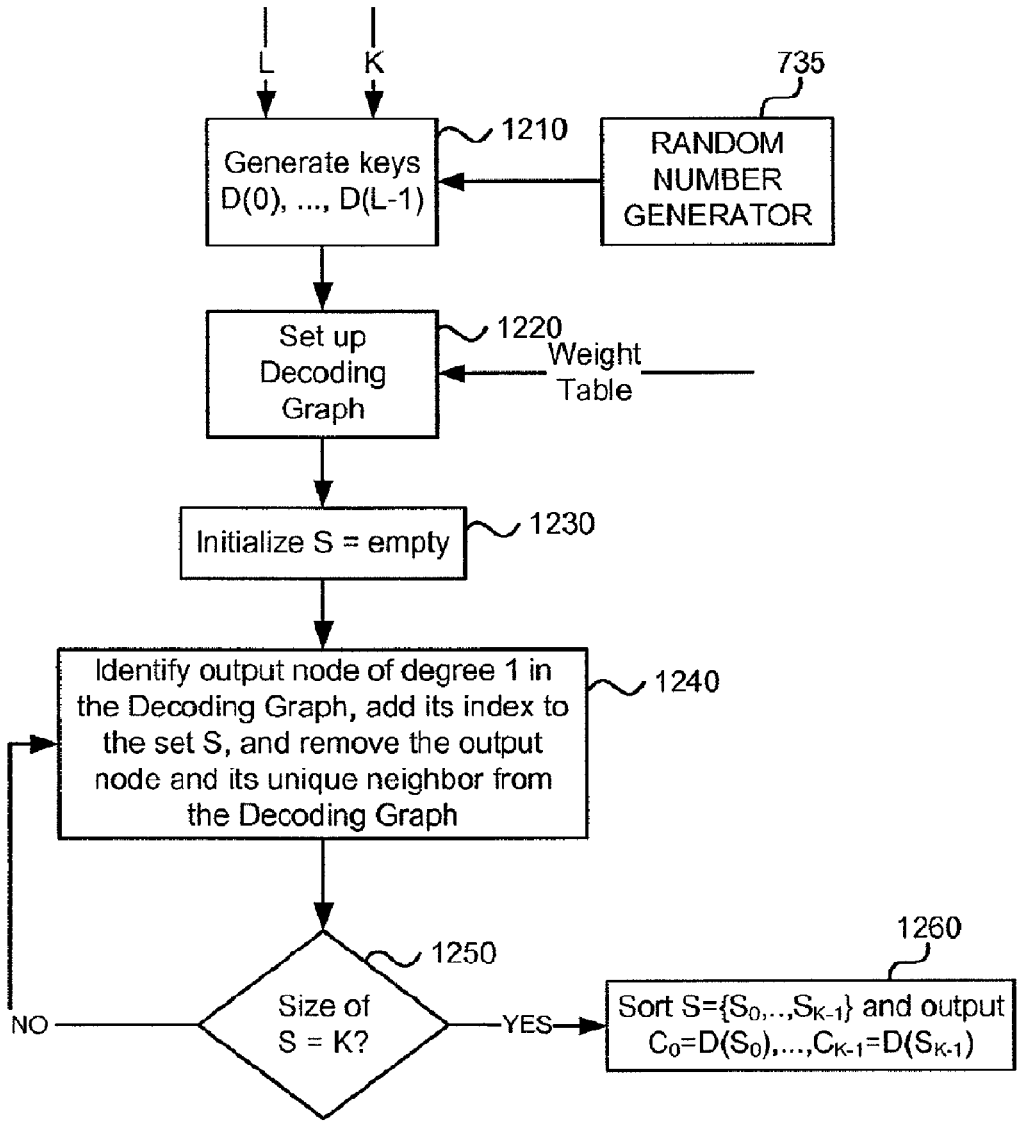
FIG. 12 illustrates a third method for generating the systematic keys in accordance with the present invention.

FIG. 12 illustrates a third method for computing the systematic keys. Similar to the method of FIG. 11 the keys D(0), . . . , D(L−1) are generated in 1210, and the Decoding Graph is set up using these keys, and possibly the weight table. Next a set S is initialized as the empty set in 1230. The set S will contain the indices of those output symbols which are used in the chain reaction decoding process to recover the value of an input node. In 1240 the chain reaction decoding process is applied to the Decoding Graph by identifying an output node of degree one. The index of this output node is added to the set S in accordance with the above-mentioned role of this set. A test is performed at 1250 as to whether the set S already has the right number of elements. If not, the algorithm loops back to 1240 where another input node of degree one is chosen to continue the decoding process. If the size of S is K, then the elements of S are sorted starting with the smallest element to yield the sorted elements $S_0, \ldots, S_{K-1}$ and the systematic keys are calculated as $C_0$=D($S_0$), . . . , $C_{K-1}$=D($S_{K-1}$) in 1260.

Figure 13:
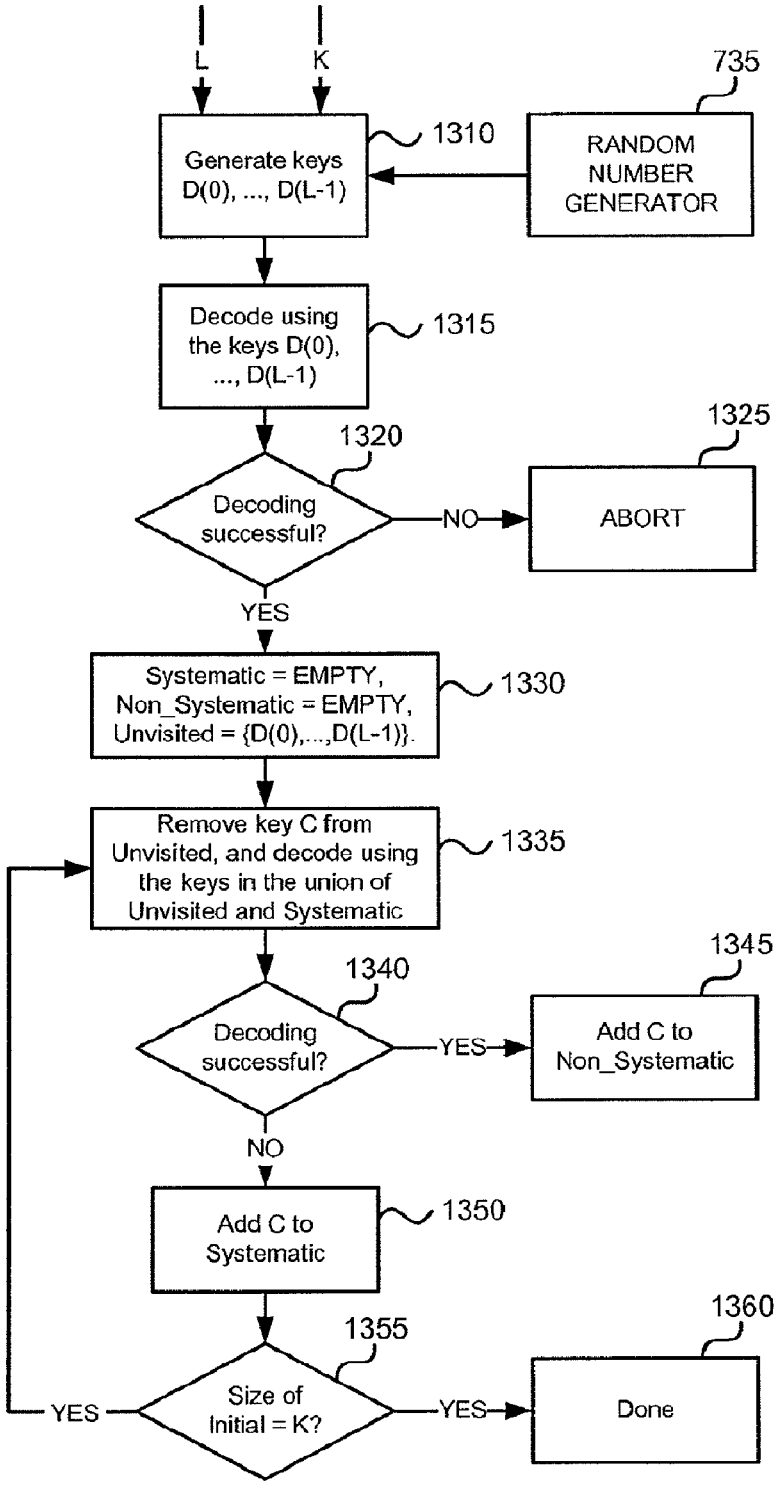
FIG. 13 illustrates a forth method for generating the systematic keys in accordance with the present invention.

FIG. 13 illustrates a fourth method for computing systematic keys in accordance with the present invention. In this method it is assumed that a decoding algorithm is available which on input K and a set of keys can decide whether the original K symbols are decodable from the given set of keys. Examples of such algorithms are provided by the decoders described in Luby I, Raptor, of Inactivation Decoding.

At 1310 L keys D(0), . . . , D(L−1) are generated. Similar to the above description, this process may be accomplished through the use of a random number generator 735, or the keys may be generated from a fixed set of re-usable keys. At 1315, the decoder is used to decide whether or not it is possible to decode the K symbols from the set of keys D(0), . . . , D(L−1). If decoding is not successful, then the given set of keys does not contain as a subset the systematic keys, and the algorithm aborts at 1325. Otherwise, three sets are initialized at 1330. These sets are called Systematic, Non_Systematic, and Unvisited, respectively. At the end of the algorithm, the set Systematic will contain the set of systematic keys. Originally, at 1330 the sets Systematic and Non_Systematic are initialized to empty sets, while the set Unvisited contains all the original keys D(0), . . . , D(L−1). At processes 1335 through 1360 a key is removed from the set Unvisited and a decoding attempt is made on the keys contained in the sets Systematic and Unvisited. If the attempt is successful, then the chosen key C does not belong to the set of systematic keys. On the contrary, if decoding is not successful, then the key does belong to the set of systematic keys. The procedure consisting of removal of an unvisited key and decoding (1335), a test as to whether decoding was successful (1340), and the following addition of the chosen key to the set Systematic or Non_Systematic based on the outcome of the decoder (1345 and 1350) are repeated as long as the set Systematic has fewer than the number K of original input symbols.

Figure 14:
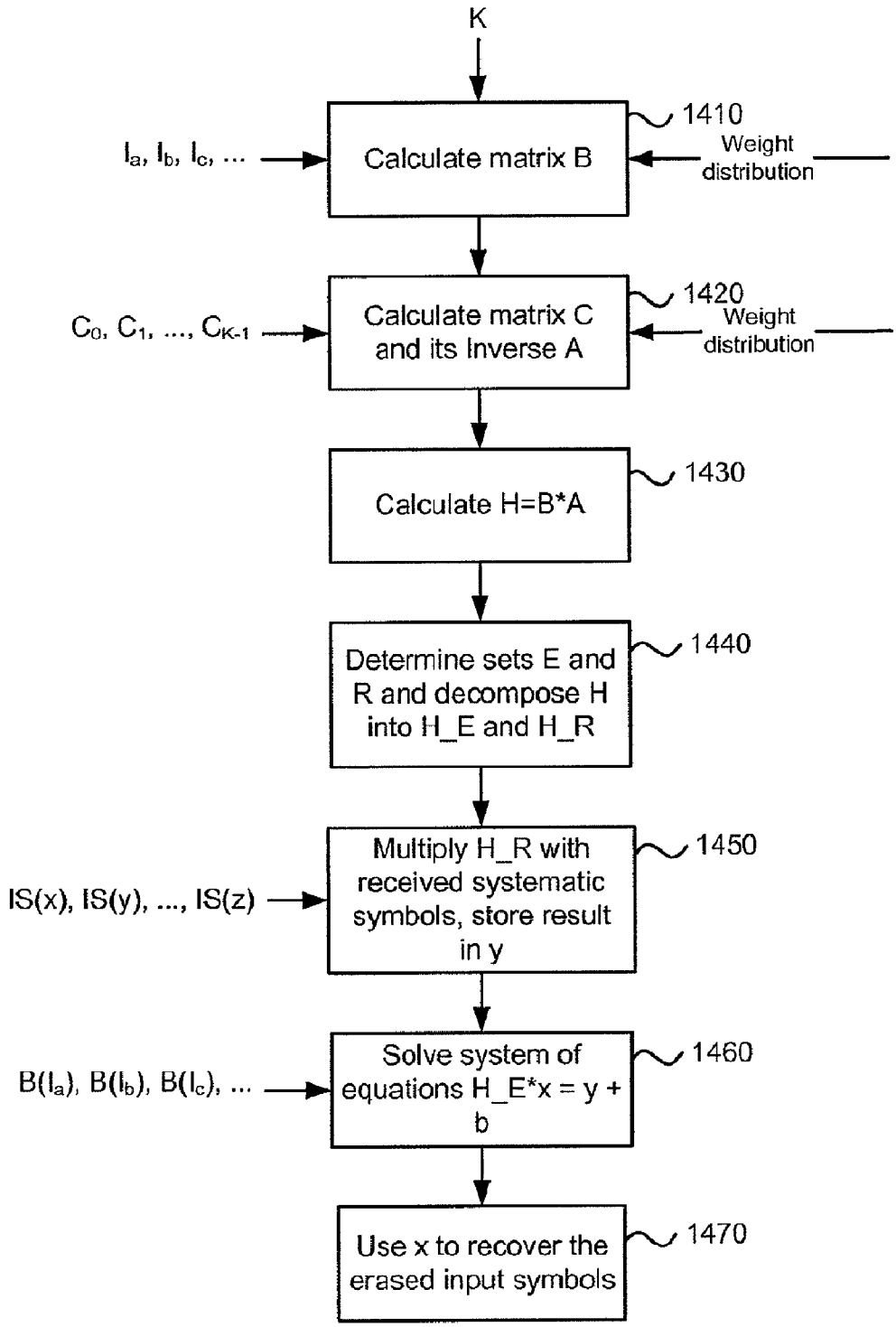
FIG. 14 illustrates a method for decoding a chain reaction code having systematic and non-systematic symbols in accordance with the present invention.

FIG. 14 illustrates a method for decoding a chain reaction code having systematic and non-systematic symbols in accordance with the present invention. At 1410, non-systematic keys $I_a$, $I_b$, . . . corresponding to the received non-systematic output symbols B($I_0$), B($I_b$), . . . are used to generate a matrix B which has as many rows as there are received non-systematic output symbols and as many columns as there are input symbols. For each key the same mechanism as for encoding chain reaction codes is used to generate a weight W and a set $J_1, J_2, \ldots, J_w$ of indices of input symbols from which the output symbol corresponding to the key is generated. Then, in the corresponding row of the matrix B the positions corresponding to $J_1, J_2, \ldots, J_w$ are set to 1, while the other positions in that row are set to 0. The procedure is repeated until all keys corresponding to non-systematic received symbols are exhausted.

Next at 1420, a similar procedure is applied to construct a square matrix C with as many rows and columns as the number of input symbols from the systematic keys $C_0$, $C_1, \ldots, C_{K-1}$. This process also computes the inverse of the matrix C, called A. Computing the inverse of A can be performed in a variety of ways, as is known to those of skill in the art. For example, a Gaussian elimination algorithm can be used to calculate A. In other embodiments a version of chain reaction decoding can be utilized to perform this step. This is further illustrated in an example later in this disclosure.

At 1430, the product of the matrices B and A is calculated over the binary field GF(2) to obtain a matrix H. Next at 1440, two sets of indices E and R are determined: E is the set of indices of the non-received systematic symbols, while R is the set of indices of the received systematic symbols. For example, assume there are 11 input symbols with indices 0, 1, 2, . . . , 10. If, after the transmission, the systematic symbols corresponding to the indices 0, 3, 9, 10 are received, then R={0,3,9,10}, while E={1,2,4,5,6,7,8}. The matrix H, computed in 1430 as the product of B and A is then subdivided into two submatrices $H_E$ and $H_R$: $H_E$ is the submatrix of H obtained by taking the columns of H corresponding to the indices of the systematic symbols not received, and HR is the submatrix of H corresponding to the indices of the received systematic symbols. In the example above, $H_E$ would be the submatrix of H formed by the columns 1, 2, 3, 4, 5, 6, 7, and 8 of H.

At 1450, the matrix $H_R$ is multiplied with the vector formed by the received systematic symbols IS(x), IS(y), . . . , IS(z). For example, in the scenario above, $H_R$ would be multiplied with the values of the systematic symbols 0, 3, 9, 10 (in this ordering). The actual multiplication can be performed in a variety of ways, as is known to those skilled in the art. The result of this multiplication, called the vector y in the following, may be stored for future use. At 1460, the non-systematic received output symbols are used to set up a vector b. Where there are L such symbols, the number of entries in the vector b is L. This step may only be logical. In other words, this step may not require any computations. Next, the results of the previous multiplication stored in the vector y is component-wise XOR'd with the entries of the vector b, i.e., each of the non-systematic received output symbols are XOR'd with the corresponding symbols of the vector y. The result of this operation may be stored in place of the received non-systematic symbols, or it may be stored at a different location.

Once this XOR has been determined, a system of linear equations is set up using the matrix $H_E$ corresponding to the erased systematic symbols. The solution x of the system $H_E$*x=y+b then corresponds to the values of the erased systematic symbols. These values are output in 1470. Again, this process can be performed in a variety of ways, for example using Gaussian elimination, or any of the variants of chain reaction decoding disclosed in Luby I, Raptor, or Inactivation Decoding.

This matrix view of the decoding is for illustrative purposes only and not restrictive. Many variations of this decoding procedure will become apparent to those of skill in the art upon review of this disclosure.

III. Exemplary Systematic Coding and Decoding

A brief example of some aspects of the operations of some embodiments of a systematic chain reaction coding system will now be given with reference to FIGS. 15-17. In all the examples given the effect of the weight table is only implicitly stated in terms of the list of neighbors of a given symbol, given its key.

Computing the Systematic Keys

Figures 15A, 15B:
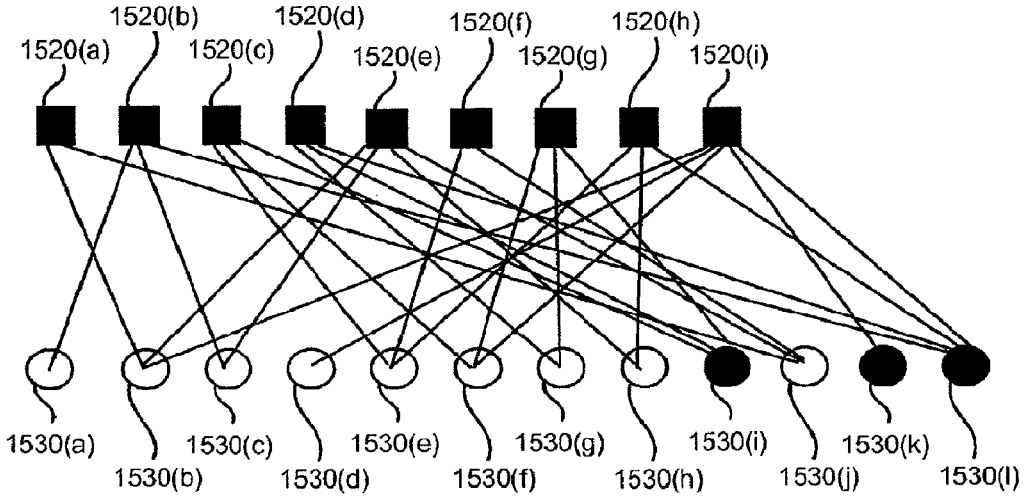
FIGS. 15-17 illustrate the encoding and decoding processes in an exemplary embodiment of the present invention.

FIG. 15A describes a Decoding Graph used to obtain systematic keys $C_0, C_1, \ldots, C_8$. It is assumed that 12 keys D(O), D(1), . . . , D(11) have already been generated, for example by the operation in 1110 of FIG. 11. The graph in FIG. 15A describes the Modified Decoding Graph between the input nodes denoted 1520(*a*), . . . , 1520(*i*), and output nodes denoted 1530(*a*), . . . , 1530(*l*) using the keys D(0), . . . , D(11). Chain reaction decoding may now be applied to this graph to obtain the systematic keys as the keys of those output nodes which trigger the recovery of an input node in the course of chain reaction decoding.

In operation, node 1530(*a*) may be used to recover the input node 1520(*b*). Accordingly, the first systematic key $C_0$ is then equal to the first of the generated keys, namely D(0). Recovery of input node 1520(*b*) causes output node 1530(*c*) to become of degree 1, and hence to trigger recovery of node 1520(*e*). Continuing in this way, it can be seen that the nodes colored light gray in FIG. 15A can be used to recover the input nodes. The sequence of output nodes used to recover the input nodes is equal to 1530(*a*), 1530(*b*), 1530(*c*), 1530(*d*), 1530(*e*), 1530(*f*),1530(*g*), 1530(*h*), 1530(*j*). As a result, the sequence of systematic keys may be chosen as shown in FIG. 15B.

It should be noted that the recovery process for the illustrated chain reaction decoding is only conceptual. In particular, no XOR operation is performed in this particular example.

Systematic Encoding

As outlined in FIG. 9A, a systematic chain reaction encoder consists of a chain reaction decoder 910 and a chain reaction encoder 920. Accordingly, the operation of systematic chain reaction encoding is divided into two parts. These two parts are exemplified in FIG. 16A and FIG. 16B, respectively.

Figure 16A:
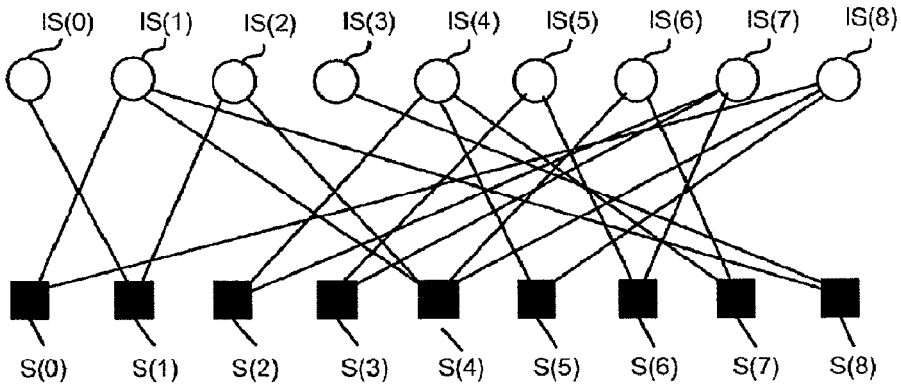
Figure 16B:
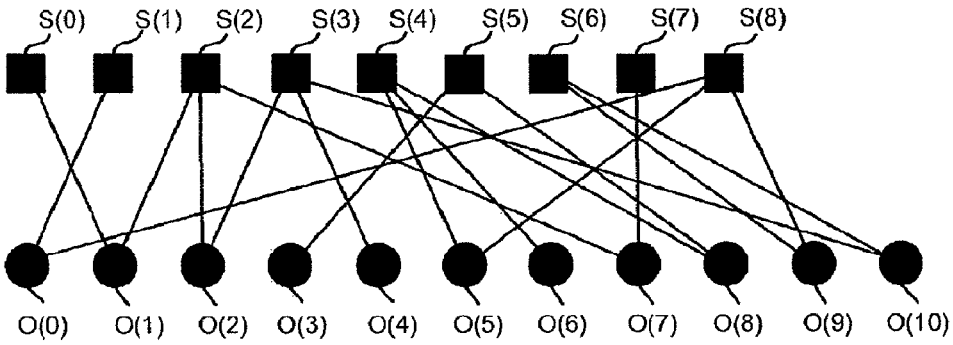

FIG. 16B exemplifies the operation of the chain reaction decoder 910. The input symbols are denoted by IS(0), . . . , IS(8). The keys $C_0, C_1, \ldots, C_8$ are used to set up the graphical dependency between the input symbols and the intermediate input symbols S(0), . . . , S(8). For example, the key $C_0$ shows that IS(0) is equal to the value of S(1), while the key $C_4$ shows that IS(4) is equal to the XOR of the values of S(2), S(5), and S(7). Chain reaction decoding can now be applied to obtain the values S(0), S(1), . . . , S(8). The schedule to obtain these values may have been forwarded to the chain reaction decoder 910 from the systematic key generator 730 in FIG. 7, since this schedule was set up to obtain the keys $C_0, C_1, \ldots, C_8$. Unlike the operation of the systematic key generator, this step may employ XOR'ing the values of the individual symbols.

In the example of FIG. 16A the schedule may first produce the value of S(1), which in turn may produce the value of S(4) using the value of IS(1). This triggers the recovery of the values of S(0), and S(7), etc.

FIG. 16B exemplifies the operation of the chain reaction encoder 920 in FIG. 9A by showing the generation of the first 11 non-systematic output symbols O(0), . . . , O(10). (The illustrated output symbols O(*i*) refers to previously described output symbols $B(I_i)$.) As was described before, the output of the systematic encoder consists of the systematic output symbols IS(0), . . . , IS(8), followed by the output symbols O(0) . . . , O(10), . . . . This particular ordering is only exemplary, and other orderings can be used in alternative embodiments under the present invention.

Systematic Decoding

Figure 17A:
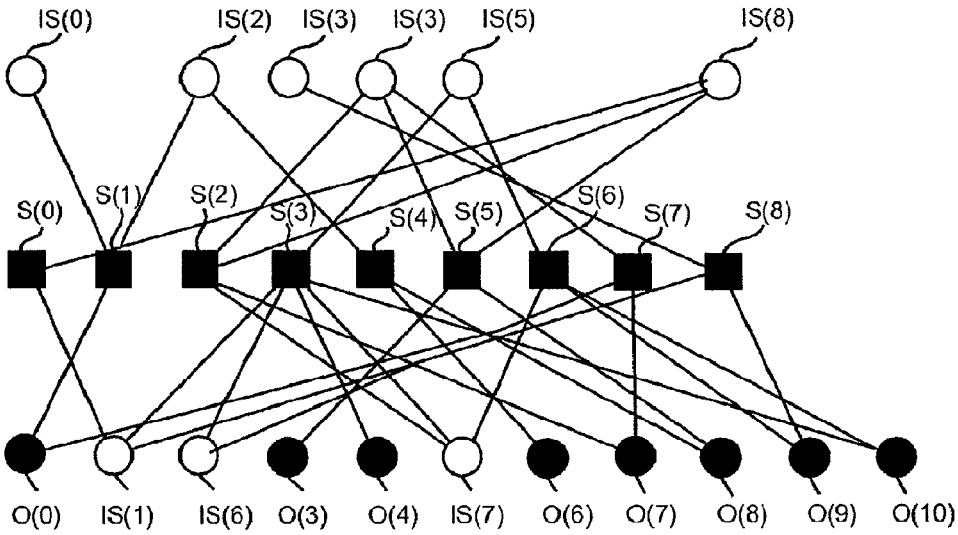
Figure 17B:
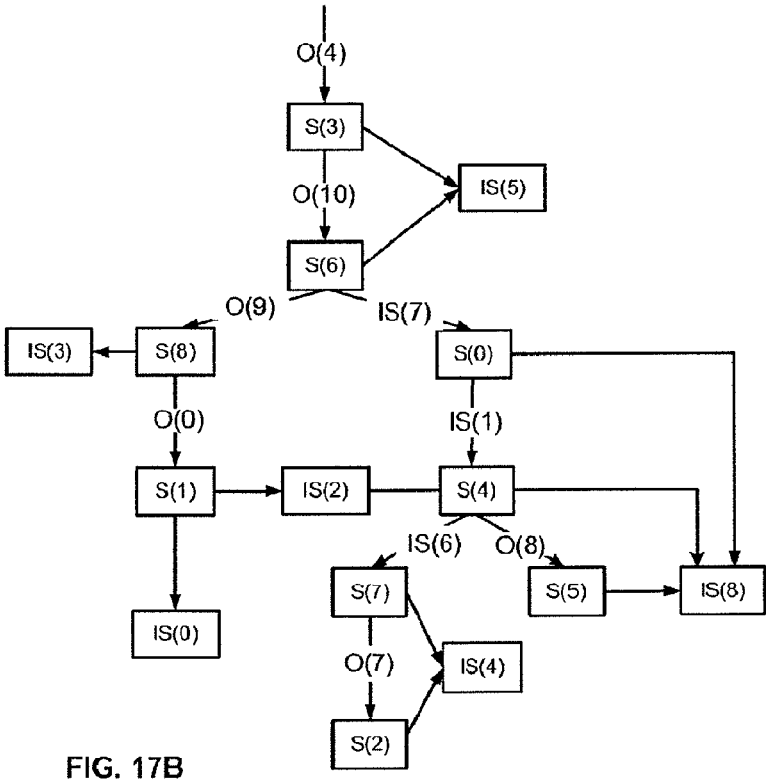

FIGS. 17A and 17B exemplify an embodiment of the process of systematic chain reaction decoding. It is assumed that the received systematic output symbols are IS(1), IS(6), and IS(7), while the received non-systematic output symbols are O(0), O(3), O(4), O(6), O(7), O(8), O(9), and O(10). The task of the decoder is to compute the values of the missing systematic output symbols, i.e., the values IS(0), IS(2), IS(3), IS(4), IS(5), and IS(8). FIG. 17A is an example of how the chain reaction decoder 930 and the chain reaction encoder 940 in FIG. 9B may be combined into one decoder. In some applications, such a combination may lead to computational savings.

Using the keys $C_1$, $C_6$, and $C_7$ corresponding to the received systematic output symbols, and the keys corresponding to the received non-systematic output symbols, a graph is set up between the received output symbols, and the intermediate input symbols S(0), . . . , S(8). A connecting line is drawn between an output symbol and all the intermediate input symbols whose XOR yields the value of the output symbol. The individual connections are the same as the ones shown in FIG. 16A and FIG. 16B. The particular ordering of the received output symbols may not be equal to the ordering chosen to represent the Decoding Graph.

This graph is extended by another layer of nodes, corresponding to the erased systematic output symbols. This graph corresponds to the upper part of FIG. 17A, in which the input symbols IS(0), IS(2), IS(3), IS(4), IS(5), and IS(8) are connected via dotted lines to those intermediate input symbols of which they are an XOR of. Again, these connections may be verified against the corresponding connections in FIG. 17A.

The process of decoding in this particular example may start by applying the chain reaction decoding to the lower graph; every time one of the intermediate symbols is recovered, its value may be XOR'd to the value of the all the neighbors of this symbol among the non-received original symbols in the upper part of the figure. Originally, the values of these symbols may be set to zero.

For example, output symbol O(4) may be used to recover the value of S(3). The value of S(3) may then be XOR'd into the current value of IS(S). After this step, the value of IS(5) is equal to that of S(3). Recovery of S(3) reduces the degree of the output node O(10) to one. This output node in turn recovers the value of the intermediate symbol S(6). This value is XOR'd into the current value of IS(5), so that after this step the value of IS(5) is recovered. The process may continue until all the non-received systematic input symbols are recovered.

FIG. 17B illustrates the process by which the missing output symbols are recovered. The recovered symbols are framed in rectangles. The recovered systematic output symbols are framed in gray rectangles. The labels of the edges in this figure describe the symbols used for the recovery.

For example, symbol O(4) is used to recover S(3). Symbol O(10) is used to recover S(6). S(3) and S(6) together recover S(5). Recovery of S(6) triggers the recovery of S(8) (using O(9)) and the recovery of S(0) (using the received systematic output symbol IS(7)). Recovery of S(8) triggers the recovery of IS(3). Recovery of S(0) triggers the recovery of S(4) (using IS(1)). On the other hand, using O(0), the recovery of S(8) triggers that of S(1), which together with S(4) recovery IS(2). Furthermore, recovery of S(1) leads to recovery of IS(0), since these values are identical. Using O(8), and the recovered value of S(4), the value of S(5) is obtained. This, in turn, recovers the value of IS(8), since the latter is the XOR of S(5), S(4), and S(0), and all these values are known at this stage. Using IS(6) and S(4), the value of S(7) is obtained. Using O(7), this recovers the value of S(2), which together with S(7) recovers the value of the last remaining input symbol, namely IS(4).

The foregoing description has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

Documents Herein Incorporated by Reference:

U.S. Pat. No. 6,307,487 to Michael G. Luby, entitled "Information Additive Code Generator and Decoder for Communication Systems" (referred to herein as Luby I);

U.S. patent application Ser. No. 09/792,364, filed Feb. 22, 2001, entitled "Scheduling of Multiple Files for Serving on a Server";

U.S. patent application Ser. No. 10/032,156, filed Dec. 21, 2001, entitled "Multi-Stage Code Generator and Decoder for Communication Systems" (referred to herein as "Raptor"); and U.S. patent application Ser. No. 10/459,370, filed Jun. 10, 2003, entitled "Systems and Processes for Decoding Chain Reaction Codes through Inactivation" (referred to herein as "Inactivation Decoding").

What is claimed is:

1. A method of encoding data into a chain reaction code having systematic output symbols and non-systematic output symbols, the method comprising:

generating, from the data, a set of input symbols, the input symbols comprising systematic output symbols;

computing systematic keys for the set of input symbols;

generating, from the set of input symbols and corresponding systematic keys, a plurality of intermediate input symbols encoding the plurality of intermediate input symbols into one or more non-systematic output symbols, wherein one or more intermediate input symbols are encoded into one non-systematic output symbol, wherein each of the one or more non-systematic output symbols is selected from an alphabet of non-systematic output symbols, and wherein each non-systematic output symbol is generated as a function of one or more of the input symbols, wherein any subset of the set of input symbols is recoverable from (i) a predetermined number of non-systematic output symbols, or (ii) a combination of (a) input symbols which are not included in the subset of input symbols that are to be recovered and (b) one or more of the non-systematic output symbols;

wherein computing systematic keys for the plurality of input symbols comprises:

(i) computing L unique keys D(0)-D(L−1), wherein L is a predefined number;

(ii) constructing a decoding matrix having K columns and L rows, wherein K corresponds to the number of input symbols, and wherein each row corresponds to a function of the key D(j), wherein j is equal to a value between 0 and L−1;

(iii) initializing a set S to contain no symbols;

(iv) applying chain reaction decoding to the decoding matrix to identify an output node to be added to set S;

(v) adding the output node to set S;

(vi) updating the decoding matrix to remove the output node;

(v) comparing size of set S to K;

(vi) if the size of set S is less than K, repeating steps (iv)-(v); and (vii) if the size of set S is equal to K, sorting the elements in set S from smallest to largest and using the sorted set S to create the systematic keys.

2. The method of claim 1 wherein computing L unique keys is done using a random number generator.

3. The method of claim 1 wherein computing L unique keys is done using a fixed-list of reusable keys.

4. A computer-readable medium comprising code for performing the method of claim 1.

5. An encoder with a processor and the computer-readable medium of claim 4.

6. A method of encoding data into a chain reaction code having systematic output symbols and non-systematic output symbols, the method comprising:

generating, from the data, a set of input symbols, the input symbols comprising systematic output symbols;

computing systematic keys for the set of input symbols;

generating, from the set of input symbols and corresponding systematic keys, a plurality of intermediate input symbols encoding the plurality of intermediate input symbols into one or more non-systematic output symbols, wherein one or more intermediate input symbols are encoded into one non-systematic output symbol, wherein each of the one or more non-systematic output symbols is selected from an alphabet of non-systematic output symbols, and wherein each non-systematic output symbol is generated as a function of one or more of the input symbols, wherein any subset of the set of input symbols is recoverable from (i) a predetermined number of non-systematic output symbols, or (ii) a combination of (a) input symbols which are not included in the subset of input symbols that are to be recovered and (b) one or more of the non-systematic output symbols;

wherein computing systematic keys for the plurality of input symbols comprises:

(i) computing L unique keys D(0)-D(L−1), wherein L is a predefined number;

(ii) determining whether it is possible if K symbols can be decoded using the L keys; wherein K corresponds to the number of input symbols;

(iii) if it is determined that K symbols cannot be decoded using the L keys, aborting the current attempt to compute systematic keys for the plurality of input symbols;

(iv) initializing a systematic set, a non-systematic set, and an unvisited set, wherein the systematic set is initialized to be empty, wherein the non-systematic set is initialized to be empty, and wherein the unvisited set is initialized to contain keys D(0)-D(L−1);

(v) removing a key, C, from the unvisited set;

(vi) determining whether it is possible that K symbols can be decoded using the union of the unvisited set and the systematic set;

(vi) if it is possible to decode K symbols in step (vi), adding key C to the non-systematic set;

(vii) if it is not possible to decode K symbols in step (vi), adding key C to the systematic set;

(viii) repeating steps (v)-(vii) until the systematic set contains at least K symbols; and (ix) using the systematic set as the systematic keys.

7. The method of claim 6 wherein the current attempt to compute systematic keys is followed by another attempt to compute the systematic keys by restarting the method at step (i).

8. The method of claim 6 wherein computing L unique keys is done using a random number generator.

9. The method of claim 6 wherein computing L unique keys is done using a fixed-list of reusable keys.

10. A computer-readable medium comprising code for performing the method of claim 6.

11. An encoder with a processor and the computer-readable medium of claim 10.

12. A method of encoding data into a chain reaction code having systematic output symbols and non-systematic output symbols, the method comprising:

generating, from the data, a set of input symbols, the input symbols comprising systematic output symbols;

computing systematic keys for the set of input symbols;

generating, from the set of input symbols and corresponding systematic keys, a plurality of intermediate input symbols encoding the plurality of intermediate input symbols into one or more non-systematic output symbols, wherein one or more intermediate input symbols are encoded into one non-systematic output symbol, wherein each of the one or more non-systematic output symbols is selected from an alphabet of non-systematic output symbols, and wherein each non-systematic output symbol is generated as a function of one or more of the input symbols, wherein any subset of the set of input symbols is recoverable from (i) a predetermined number of non-systematic output symbols, or (ii) a combination of (a) input symbols which are not included in the subset of input symbols that are to be recovered and (b) one or wore of the non-systematic output symbols;

wherein computing systematic keys for the plurality of input symbols comprises:

(i) computing L unique keys D(0)-D(L−1), wherein L is a predefined number;

(ii) constructing a modified decoding matrix having K columns and rows, wherein K corresponds to the number of input symbols, and wherein for any value of j between 0 and L−1 the row entries along the $j^{th}$ row are computed as a function of the key D(j); and (iii) solving the set of linear equations described by the modified decoding matrix, wherein the systematic keys are computed as a function of the solutions of the linear equations;

wherein computing L unique keys is done using a random number generator.

13. A method of decoding a chain reaction code having systematic output symbols and non-systematic output symbols into a set of input symbols, the input symbols comprising data which is sought, the method comprising:

providing a first subset of the set of input symbols, the first subset of input symbols comprising one or more systematic output symbols;

providing one or more non-systematic output symbols, wherein each non-systematic output symbol is selected from an alphabet of non-systematic output symbols, and wherein each non-systematic output symbol is generated as a function of one or more of the input symbols; and recovering a remaining subset of the input symbols comprising one or more input symbols not included in the first set of input symbols, the remaining subset of input symbols recovered from: (i) a predetermined number of non-systematic output symbols; or (ii) a combination of (a) one or more input symbols from the first subset, and (b) one or more non-systematic output symbols;

wherein recovering a remaining subset of the input symbols comprises:

(i) creating a matrix B, wherein the number of rows in B corresponds to the number of provided non-systematic output symbols and wherein the number of columns in B corresponds to the number of input symbols;

(ii) creating a matrix C, wherein the number of rows in C corresponds to the number of systematic keys and wherein the number of columns in C corresponds to the number of input symbols.

(iii) creating a matrix A as the inverse of matrix C;

(iv) creating a matrix H from the product of B and A;

(v) creating a set E, wherein E is the set of indices of the non-provided systematic symbols;

(vi) creating a set R, wherein R is the set of indices of the provided systematic symbols;

(vii) dividing matrix H into sub-matrices He and Hr, wherein He corresponds to the indices of the systematic symbols not provided and wherein Hr corresponds to the indices of the systematic symbols provided;

(ix) creating vector y from the product of Hr with a vector formed by the provided systematic symbols;

(x) creating vector b from the provided non-systematic output symbols and vector y;

(xi) solving the system of equations for x, wherein the system of equations is He*x=y+b; and (xii) using x to recover input symbols.

14. The method of claim 13 wherein step (iii) creates the inverse matrix using Gaussian elimination.

15. The method of claim 13 wherein step (iii) creates the inverse matrix using chain reaction decoding.

16. The method of claim 13 wherein step (xi) solves the system of equations using Gaussian elimination.

17. The method of claim 13 wherein step (xi) solves the system of equations using chain reaction decoding.

18. The method of claim 13 wherein step (xi) solves the system of equations using inactivation decoding.

19. A computer-readable medium comprising code for performing the method of claim 13.

20. A decoder with a processor and the computer-readable medium of claim 19.

* * * * *